United States Patent
Nomura et al.

(10) Patent No.: US 7,850,827 B2
(45) Date of Patent: Dec. 14, 2010

(54) DOUBLE-LAYER SHUTTER CONTROL METHOD OF MULTI-SPUTTERING SYSTEM

(75) Inventors: Shuji Nomura, Akishima (JP); Ayumu Miyoshi, Zama (JP); Hiroshi Miki, Tama (JP)

(73) Assignee: Canon Anelva Corporation, Kawasaki-shi, Kanagawa (JP)

(*) Notice: Subject to any disclaimer, the term of this patent is extended or adjusted under 35 U.S.C. 154(b) by 995 days.

(21) Appl. No.: 11/078,549

(22) Filed: Mar. 14, 2005

(65) Prior Publication Data

US 2005/0199490 A1    Sep. 15, 2005

(30) Foreign Application Priority Data

Mar. 12, 2004    (JP)    ............... 2004-070929

(51) Int. Cl.
*C23C 14/22* (2006.01)

(52) U.S. Cl. ............... 204/192.1; 204/192.12; 204/298.11; 204/298.26

(58) Field of Classification Search ............ 204/298.11, 204/298.26, 192.1, 192.12
See application file for complete search history.

(56) References Cited

U.S. PATENT DOCUMENTS

| | | | | | |
|---|---|---|---|---|---|
| 3,864,239 | A | * | 2/1975 | Fletcher et al. | 204/298.06 |
| 4,576,699 | A | * | 3/1986 | Sato et al. | 204/192.26 |
| 6,051,113 | A | * | 4/2000 | Moslehi | 204/192.12 |
| 2002/0064595 | A1 | * | 5/2002 | Nomura et al. | 427/131 |
| 2004/0084305 | A1 | * | 5/2004 | Fukuchi et al. | 204/298.02 |

* cited by examiner

*Primary Examiner*—Nam X Nguyen
*Assistant Examiner*—Jason M Berman
(74) *Attorney, Agent, or Firm*—Buchanan Ingersoll & Rooney PC

(57) ABSTRACT

A double-layer shutter control method of a multi-sputtering system provided with three targets in a single chamber and a double-layer rotating shutter mechanism having shutter plates which independently rotate and have holes formed therein, comprising selecting a target by a combination of holes of a first shutter plate and a second shutter plate and uses the selected target for a pre-sputtering step and a main sputtering step with continuous discharge so as to deposit a film on a substrate, whereby it is possible to prevent cross-contamination between targets due to target substances etc. deposited on the shutter plates.

11 Claims, 20 Drawing Sheets

FIG. 2A
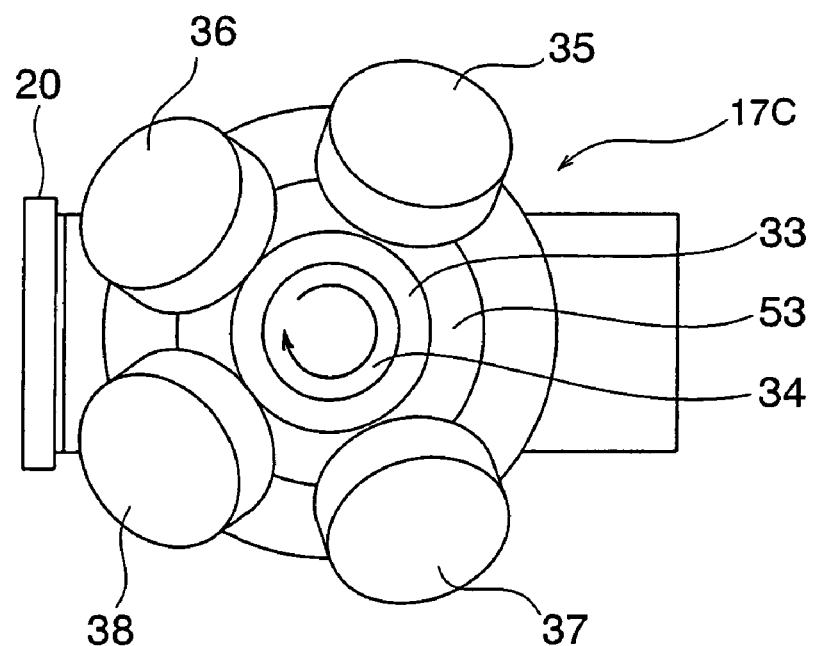
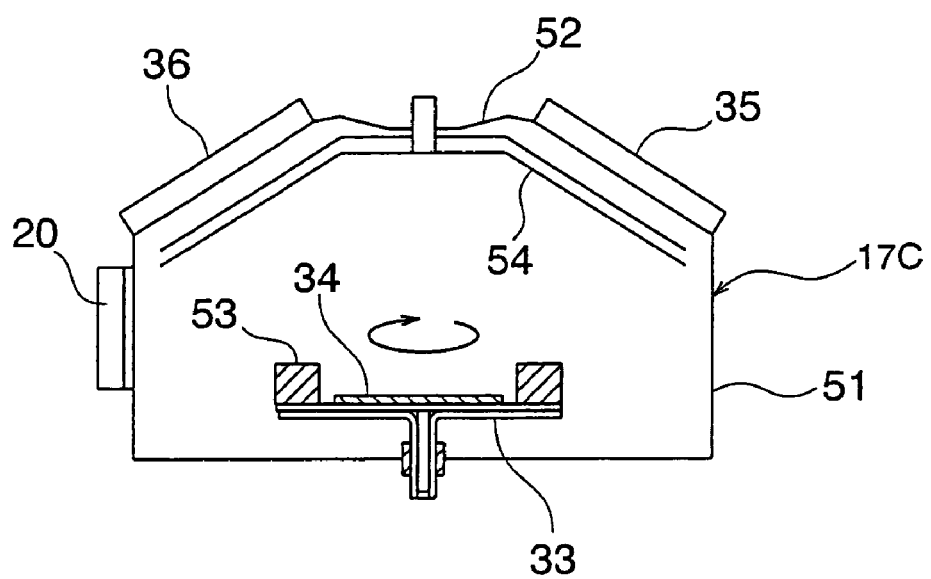
FIG. 2B (A) USING TARGETS T1 AND T3 FOR SPUTTERING (B) USING TARGETS T2 AND T4 FOR SPUTTERING (C) USING TARGETS T1 AND T4 FOR SPUTTERING (D) USING TARGETS T2 AND T5 FOR SPUTTERING (E) USING TARGETS T3 AND T5 FOR SPUTTERING

FIG. 25

NUMBER OF HOLES OF FIRST AND SECOND SHUTTER PLATES(61, 62)AND SHUTTERS USED FOR PRE-SPUTTERING

| Number n of targets | Shutter used | Number of holes of shutter | | | |
|---|---|---|---|---|---|
| | | Single sputtering | | Co-sputtering | |
| | | Second shutter plate 62 | First shutter plate 61 | Second shutter plate 62 | First shutter plate 61 |
| Even number | Only first shutter plate | 1 2 | n/2 | 2 | n/2 |
| | Both | - | - | - | - |
| Odd number | Only first shutter plate | 1 2 | n/2+1 n/2 | 2 | n/2+1 |
| | Both | 2 | n/2 | 2 3 | n/2 |

DOUBLE-LAYER SHUTTER CONTROL METHOD OF MULTI-SPUTTERING SYSTEM

BACKGROUND OF THE INVENTION

1. Field of the Invention

The present invention relates to a shutter control method for a multi-sputtering system. It also relates to a double-layer shutter control method suitable for preventing cross-contamination in a multi-sputtering system providing a plurality of targets made of different materials in a single chamber and forming a multi-layer film utilizing a double-layer rotating shutter mechanism.

2. Description of the Related Art

The assignee previously proposed a magnetic multi-layer film-forming system (U.S. Patent Application Publication No. 2002/0064595). When producing a giant magnetoresistance (GMR) or tunnel magnetoresistance (TMR) head, MRAM, etc., this magnetic multi-layer film-forming system can form a required multi-layer film in a single chamber by sputtering from the lowermost layer to the uppermost layer on a substrate continuously without interruption and can deposit a large number of magnetic films at one time.

In order to enable formation of a multi-layer film by sputtering as described above, this film-forming system provides, for example, five targets made of different materials at a chamber ceiling, that is, the space above the substrate to be formed with the film, in a single chamber, then using a shutter mechanism for selecting the target for sputtering. This shutter mechanism has a double-layer structure of independently rotating shutters. Each of the two shutter plates is formed at required positions with a required number of holes through which selected targets can be seen from the substrate side. The double-layer rotating shutter mechanism shields the targets of the materials not being used for sputtering. The target for sputtering appears to the substrate through the corresponding holes. This double-layer rotating shutter mechanism independently rotates two substantially circular shutter plates as seen from a parallel arranged substrate. Due to this, matching positions of the holes of the shutter plates are selected. The double-layer rotating shutter mechanism is used so as to make the target made of the material being used for sputtering face the substrate through the holes so as to select the target for sputtering.

The above multi-layer film-forming system is a multi-sputtering system providing a plurality of targets made of different materials in a single sputtering chamber, sequentially depositing films made of different materials on a substrate, and thereby forming a multi-layer film. This multi-sputtering system, as explained above, suitably shields the five targets made of the different materials by the double-layer rotating shutter mechanism in the single sputtering chamber to select the target used for sputtering and thereby performs the sputtering according to a previously set film-forming sequence.

When selecting a plurality of targets made of different materials by the double-layer rotating shutter mechanism and using the same for sputtering in a specific sequence, cross-contamination may be caused between targets.

For example, sputtering includes a state of "pre-sputtering" causing a discharge to start the sputter state in the state with the target for sputtering covered by the shutter mechanism and a state of "main sputtering" completely opening the shutter mechanism to perform the sputtering on the substrate. At this time, cross-contamination will occur due to (1) deposition of different types of substances deposited on the surface of the shutter plate facing the target onto the target surface due to the sputtering action at the time of the pre-sputtering; (2) sputtering of different types of substances deposited on the target surface onto the substrate at the time of the main sputtering; (3) deposition of sputter atoms rebounding from the substrate in the middle of the main sputtering onto another target surface; and so on. When shifting from pre-sputtering to main sputtering by rotating the shutters for the pre-sputtering to shift to the main sputtering, the contamination explained in (1) occurs after locations where different types of substances are deposited are passed through during the rotation of the shutter plates. This becomes a conspicuous problem.

In order to deposit a multi-layer film with good film properties on a substrate, prevention of the various cross-contaminations described above becomes indispensable.

U.S. Patent Application Publication No. 2002/0064595 shows one method of operation in the double-layer rotating shutter mechanism in FIG. 5A and FIG. 5B thereof. This comprises positioning a target side first shutter plate and a substrate side second shutter plate in the initial state so as to position a hole of the second shutter plate with the target for sputtering and to position the holes of the first shutter plate away from the target for sputtering, then starting the pre-sputtering. This pre-sputtering is sputtering for removing oxides and other surface contaminants on the surface of the target. Next, the first shutter plate is rotated to align a hole thereof with the above hole of the second shutter plate to expose the target for sputtering with respect to the substrate and perform the main sputtering on the substrate. The main sputtering is the basic sputtering for the film formation. In this way, this shows an operation of the double-layer rotating shutter mechanism in the main sputtering for exposing only the target for sputtering with respect to the substrate at the time of the main sputtering to prevent the intermixture of the materials of the other targets and thereby prevent cross-contamination.

As explained above, however, cross-contamination is a complex phenomenon changing in accordance with the number of targets, the number of holes, and other conditions. Various types of cross-contamination occur. Further, the method of rotation of the shutter plates of U.S. Patent Publication No. 2002/0064595 does not discuss at all how to deal with the target materials deposited on the shutter plates at the time of the pre-sputtering. As described above, the method of operation of the double-layer rotating shutter mechanism disclosed in U.S. Patent Application Publication No. 2002/0064595 is not sufficient to deal with any cross-contamination which may occur.

Therefore, it is desired to provide a multi-sputtering system, provided with a plurality of targets made of different materials in a single sputtering chamber for sputtering of a multi-layer film on a substrate and provided with a double-layer rotating shutter mechanism for selecting a target for sputtering at the film formation space side of the plurality of targets, which prevents contamination of the other targets by the target substances deposited on the double-layer shutters along with the sputtering sequence of the multi-layer film by optimally controlling the sequence of the shield operation of the double-layer shutter plates.

OBJECTS AND SUMMARY

An object of the present invention is to provide a double-layer shutter control method of a multi-sputtering system, provided with a plurality of targets in a single chamber for sputtering a multi-layer film and selecting a target by a double-layer rotating shutter mechanism, which prevents cross-contamination between targets due to the target substances etc. deposited on the shutter plates.

To attain the above object, an embodiment of the double-layer shutter control method of the multi-sputtering system according to the present invention is constituted as follows.

This double-layer shutter control method is a shutter control method used in a multi-sputtering system provided with at least three targets provided in a single chamber and a double-layer rotating shutter mechanism having first and second shutter plates arranged facing these targets, independently rotating, and having holes formed at predetermined positions, which selects a target for sputtering from among the at least three targets by a combination of holes of the first shutter plate and the second shutter plate and uses the selected targets for a pre-sputtering step and a main sputtering step with continuous discharge so as to deposit a film on the substrate, comprising rotating the first shutter plate so as to cover the target selected by the first shutter plate and expose it to the substrate through the second shutter plate at the pre-sputtering step and so as to expose the selected target with respect to the substrate through the first shutter plate at the main sputtering step and controlling the rotation operation of the first shutter plate so that, at the pre-sputtering step, a deposit at a facing location of the first shutter plate covering the selected target becomes the same substance as the substance of the selected target and so that the position of the first shutter plate for the pre-sputtering becomes a position adjacent to a hole of the shutter plate.

That is, the above double-layer shutter control method covers the specific target selected for sputtering and the other targets by the first shutter plate at the time of the pre-sputtering and rotates the first shutter plate to expose the selected target with respect to the substrate side through one hole at the time of the main sputtering. In the rotation operation of the first shutter plate near the target at the time of the pre-sputtering and at the time of the main sputtering, since substances of a plurality of targets are deposited onto the surface of the first shutter plate on the target side at the time of the discharge in the pre-sputtering, the rotation operation of the first shutter plate is controlled so that a location where substances of other targets are deposited does not face the front of the selected target during the pre-sputtering and when shifting from the pre-sputtering to the main sputtering. Due to this, the deposition of other target substances onto the surface of the target for sputtering at the time of the pre-sputtering can be prevented and cross-contamination at the time of the main sputtering can be prevented.

This double-layer shutter control method is preferably a method of controlling the rotation operations of the first shutter plate and the second shutter plate so that a location at the first shutter plate where a substance different from that of the selected target was deposited at the time of a previous discharge is not faced during discharge of the selected target. When the first shutter plate rotates at the time of discharge in the pre-sputtering step etc., cross-contamination can be avoided so long as other target substances deposited on the first shutter plate do not pass through a location facing the target selected for sputtering. When rotating the shutters for the pre-sputtering to shift to the main sputtering in order to shift from the pre-sputtering to the main sputtering, the contamination explained in the above (1) occurs when passing through a location where different types of substances are deposited during the rotation of the shutter plate. This becomes a conspicuous problem.

This double-layer shutter control method preferably exposes only a selected target through holes of the first and second shutter plates when seen from the substrate at the time of the main sputtering. When performing the main sputtering, the selected target is used for sputtering, whereby particles of the sputtered target substance move toward the substrate through holes of the first shutter plate and the second shutter plate and deposit on the surface of the substrate.

This double-layer shutter control method preferably exposes one selected target in the case of single sputtering. In the case of single sputtering, only the substance given by one target is deposited on the substrate, so one selected target can be seen through the holes of the first and second shutter plates when seen from the substrate side.

This double-layer shutter control method alternatively preferably exposes at least two selected targets in the case of co-sputtering. In the case of co-sputtering, a film is deposited on the substrate by simultaneous sputtering of two types of targets made of different substances, so at least two selected targets can be seen through the holes of the first and second shutter plates when seen from the substrate side.

This double-layer shutter control method preferably sets the number of holes of the first shutter plate at n/2 when the number of the plurality of targets is an even number (n: n>3).

This double-layer shutter control method alternatively preferably sets the number of holes of the first shutter plate at (n/2)+1 when the number of the plurality of targets is an odd number (n: n$\geq$3).

According to another embodiment of the invention, there is provided a double-layer shutter control method of a multi-sputtering system provided with five different types of targets provided in a chamber and a double-layer rotating shutter mechanism having first and second shutter plates arranged facing the five targets, independently rotating, and each having two holes formed therein, which suitably selects one or two targets for sputtering from among the five targets by a combination of holes of the first shutter plate and the second shutter plate and uses the selected targets for a pre-sputtering step and a main sputtering step with continuous discharge so as to deposit a film on the substrate for co-sputtering or single sputtering, comprising operating the first and second shutter plates so that, in the co-sputtering and single sputtering, the same target substances are deposited at the same locations as deposition of films on the first and second shutter plates due to the pre-sputtering step and thereby performing the co-sputtering and the single sputtering in a single chamber system.

The above double-layer shutter control method forms deposits obtained by the same substances at the same locations of the first shutter plate and the second shutter plate at each of the time of the pre-sputtering step of the co-sputtering and the time of the pre-sputtering step of the single sputtering in a single sputtering chamber, whereby it becomes possible to perform the co-sputtering and single sputtering without cross-contamination.

This double-layer shutter control method preferably controls operations of the first and second shutter plates so as to give priority to the co-sputtering between the co-sputtering and the single sputtering.

This double-layer shutter control method alternatively first executes the co-sputtering, then executes the single sputtering.

This double-layer shutter control method preferably exposes only the selected target through the holes of the first and second shutter plates when seen from the substrate at the time of the main sputtering.

As described above, according to an embodiment of the present invention, there is provided a control method of a double-layer shutter mechanism enabling independent rotation of shutter plates with respect to a plurality of targets arranged in a single chamber of a multi-sputtering system which controls the rotation operation of the first shutter plate near the target at the time of the pre-sputtering and the time of the main sputtering so that substances of a plurality of targets are deposited on the surface of the first shutter plate on the target side during the discharge of the pre-sputtering, but there is no location where substances of other targets are deposited in front of the target selected for sputtering during the discharge of the pre-sputtering and when maintaining the discharge state and shifting from the pre-sputtering to the main sputtering, and controlling the rotation operation of the shutter plates so that locations of different types of deposited substances are not passed through at the time of shifting from the pre-sputtering to the main sputtering by switching the movement of the first and second shutter plates. Due to this, the deposition of another target substance onto the surface of a target at the time of the pre-sputtering can be prevented, and cross-contamination at the time of the main sputtering can be prevented.

Further, according to an embodiment of the present invention, co-sputtering and single sputtering can be carried out by suitable procedures by a single common system configuration in a sputtering system provided with five targets in a single sputtering chamber and provided with a double-layer rotating shutter mechanism having a first shutter plate and a second shutter plate each having two holes at predetermined angles and suitably controlling the rotation of these independently.

BRIEF DESCRIPTION OF THE DRAWINGS

These and other objects and features of the present invention will become clearer from the following description of the preferred embodiments given with reference to the accompanying drawings, in which:

FIG. 2A is a plan view of the state of arrangement of a plurality of targets in a single sputtering chamber of the magnetic multi-layer film-forming system;

FIG. 2B is a vertical sectional view of the sputtering chamber;

FIG. 25 is a table showing relationships between a number of targets and a number of holes of the first and second shutter plates.

DESCRIPTION OF THE PREFERRED EMBODIMENTS

Figure 1:
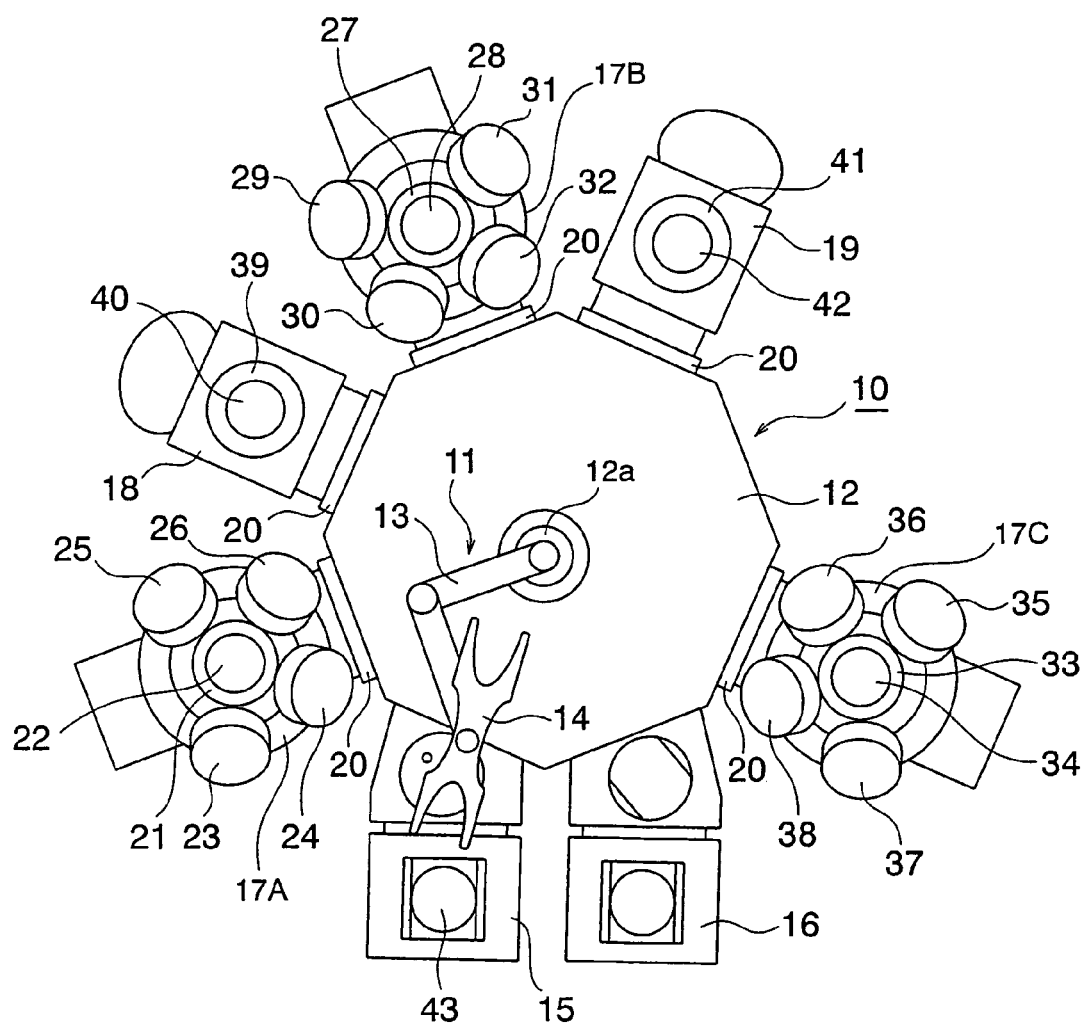
FIG. 1 is a plan view of a magnetic multi-layer film-forming system to which an embodiment of the present invention is applied.

Below, preferred embodiments of the present invention will be described with reference to the accompanying drawings. First, an embodiment of the multi-sputtering system to which the double-layer shutter control method according to the present invention is applied will be shown by referring to FIG. 1. This multi-sputtering system is a system for preparing a multi-layer film by sputtering. In this example, an example of a magnetic multi-layer film is shown as the multi-layer film. FIG. 1 is a plan view shown to an extent showing the schematic configuration of the internal mechanism of the magnetic multi-layer film-forming system. This magnetic multi-layer film-forming system 10 is a cluster type provided with a plurality of film-forming chambers. A carrier chamber 12 provided with a robot transporter 11 at the center position. The robot transporter 11 is provided with an arm 13 which is freely extended or retracted and a hand 14 for carrying the substrate. The base end of the arm 13 is rotatably attached to a center portion 12a of the carrier chamber 12.

The carrier chamber 12 of the magnetic multi-layer film-forming system 10 is provided with load/unload chambers 15 and 16. The load/unload chamber 15 enables the substrate to be processed to be loaded into the magnetic multi-layer film-forming system 10 from the outside and enables the substrate finished being formed with the magnetic multi-layer film to be unloaded from the magnetic multi-layer film-forming system 10. The load/unload chamber 16 has the same functions. The substrate loaded through the load/unload chamber 16 is unloaded from the same chamber. The reason for providing two load/unload chambers is to raise the productivity by alternately using two chambers.

This magnetic multi-layer film-forming system 10 is provided with three film-forming chambers 17A, 17B, and 17C, one oxide film-forming chamber 18, and one cleaning chamber 19 around the carrier chamber 12. A gate valve 20 which separates two chambers and can be freely opened or closed according to need is provided between each two chambers. Note that each chamber is equipped with a vacuum exhaust mechanism, a material gas introduction mechanism, a power supply mechanism, etc., but the illustration of them is omitted.

Each of the film-forming chambers 17A, 17B, and 17C is a chamber for continuously forming films for a plurality of magnetic films belonging to the same group in the same chamber. This embodiment is configured to divide the component films of the magnetic multi-layer film to be deposited on the substrate into for example the three groups A, B, and C from the bottom side and deposit the plurality of magnetic films for each group in one common film-forming chamber. This results in a cluster type magnetic multi-layer film-forming system. Each of the film-forming chambers 17A, 17B, and 17C depositing the plurality of magnetic films divided into the groups by A, B, and C and belonging to the same group deposits the magnetic films by physical vapor deposition (PVD) utilizing sputtering.

The film-forming chamber 17A for forming the magnetic films belonging to the group A continuously deposits each of for example four types of magnetic films in a predetermined sequence. For this reason, the film-forming chamber 17A is provided with four targets 23 to 26 corresponding to the four types of magnetic materials attached to the ceiling for a substrate 22 arranged on a substrate holder 21 at the center of the bottom portion. Note that, in FIG. 1, the illustration of the vacuum exhaust mechanism for making the inside of the film-forming chamber 17A a vacuum state, the mechanism for supplying the power required for sputtering of the targets 23 to 26, the mechanism for generating plasma, and other mechanisms is omitted. The same is also true for the other film-forming chambers.

The film-forming chamber 17B for forming the magnetic films belonging to the group B continuously deposits the different plurality of types of magnetic films in a predetermined sequence. In the same way as the above description, it is provided with the targets 29 to 32 corresponding to the various types of magnetic material attached to the ceiling for a substrate 28 arranged on a substrate holder 27 at the center of the bottom portion.

The film-forming chamber 17C for forming magnetic films belonging to the group C, in the same way as the above description, is provided with targets 35 to 38 corresponding to the various types of magnetic materials attached to the ceiling for the substrate 34 arranged on a substrate holder 33 at the center of the bottom portion.

The oxide film-forming chamber 18 performs a surface chemical reaction for oxidizing a metal layer. In the oxide film-forming chamber 18, 39 is a substrate holder, and 40 is a substrate.

The cleaning chamber 19 is provided with an ion beam etching mechanism and an RF sputtering mechanism and flattens the surface of the substrates. In the cleaning chamber 19, 41 is a substrate holder, and 42 is a substrate.

In the magnetic multi-layer film-forming system 10 having the above configuration, a substrate 43 loaded into the system through the load/unload chamber 15 is successively introduced into each of the film-forming chambers 17A, 17B, and 17C, the oxide film-forming chamber 18, and the cleaning chamber 19 by the robot transporter 11 in a previously determined sequence in accordance with the magnetic multi-layer film device to be prepared. Predetermined treatment such as film formation and etching are carried out in the chambers.

Next, the characterizing structures provided in each of the film-forming chambers 17A to 17C will be explained in more detail by referring to FIGS. 2A and 2B. FIG. 2A is a plan view of the film-forming chamber 17C as an example, while FIG. 2B is a vertical sectional view showing the characterizing structure. In FIGS. 2A and 2B, the same notations are assigned to components substantially the same as the components explained in FIG. 1.

A ceiling 52 of a vessel 51 of the film-forming chamber 17C is provided with four targets 35 to 38 as explained above. These targets 35 to 38 are attached in an inclined state at the ceiling 52. In this illustrated example, for convenience of the explanation, the targets themselves are shown as 35 to 38, but actual targets are accommodated in target housings having openings in the surfaces facing the substrate side.

The substrate holder 33 rotatably provided at the center of the bottom surface of the film-forming chamber 17C carries a substrate 34 in a horizontal state. At the time of sputtering onto the substrate 34, the substrate 34 is rotating. Note that a ring-like magnet 53 is disposed around the substrate 34 on the substrate holder 33. The targets 35 to 38 provided inclined are arranged to face the upper surface of the substrate 34 horizontally arranged beneath them. A double-layer rotating shutter mechanism 54 is arranged between these targets and the substrate 34. The double-layer rotating shutter mechanism 54 has a double-layer structure of independently rotating shutter plates. The shutter mechanism 54 is operated to select the target for sputtering among the four targets 35 to 38. By such a configuration, oblique incidence of the sputtered target substance is realized, a high uniform film thickness distribution is achieved in the formation of the multi-layer film, and contamination between targets and contamination between magnetic films are prevented.

Figure 3:
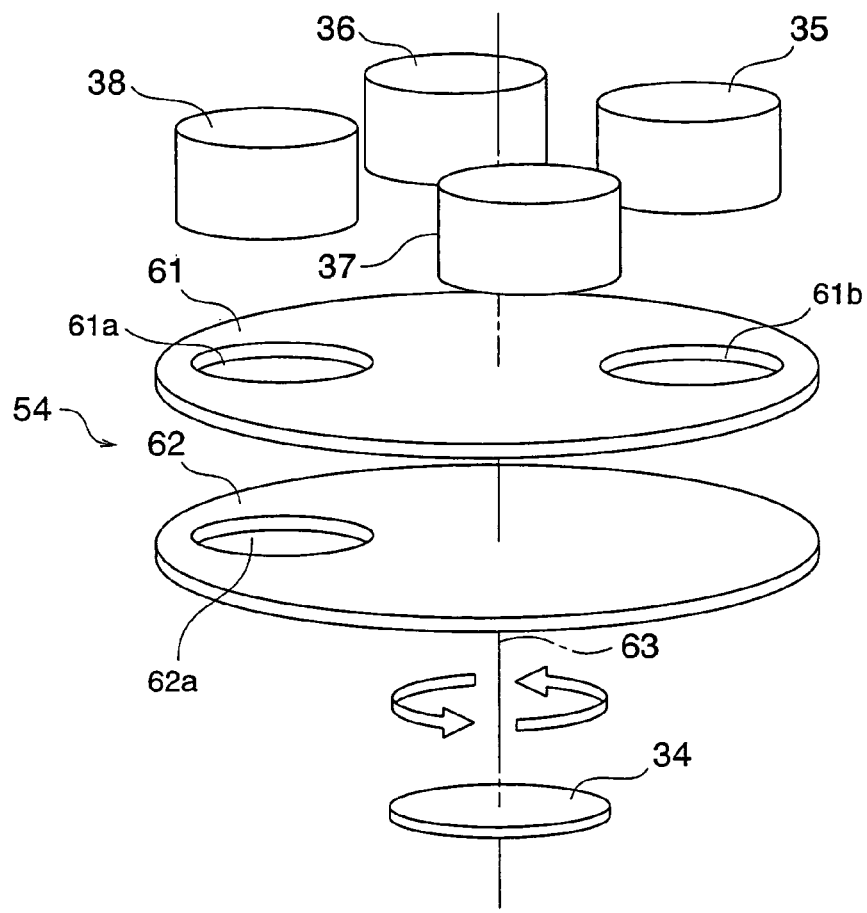
FIG. 3 is a view of the disassembled configuration showing a representative configuration of the double-layer rotating shutter mechanism.

The structure and operation of the double-layer rotating shutter mechanism 54 will be conceptually explained in more detail by referring to FIG. 3. This figure shows a state of four targets 35 to 38 arranged in parallel for simplifying the explanation. The double-layer rotating shutter mechanism 54 is provided so that two shutter plates 61 and 62 are arranged substantially parallel and they can be individually freely rotated around a shaft 63. In FIG. 2B, the targets 35 to 38 and the shutter plate of the double-layer rotating shutter mechanism 54 are arranged inclined in posture, but they are positioned parallel to each other, therefore FIG. 3 is shown taking note of this point.

In the double-layer rotating shutter mechanism 54, the shutter plate 61 is the target side shutter plate (first shutter plate), and the shutter plate 62 is the substrate side shutter plate (second shutter plate). The shutter plate 61 is formed with two holes 61a and 61b arranged in for example the diameter direction, while the shutter plate 62 is formed with for example one hole 62a. The numbers and positions of the holes are just one example. The present invention is not limited to these as will be explained later.

In the state shown in FIG. 3, the positions of the hole 61a of the shutter plate 61 and the hole 62a of the shutter plate 62 are aligned with the target 38 for sputtering utilizing the target 38 so as to deposit a predetermined magnetic film on the surface of the rotating substrate 34. At this time, the targets 36 and 37 are covered by the two shutter plates 61 and 62 to prevent deposition of the sputtered target substance. Further, the target 35 faces the hole 61b in the shutter plate 61, but is covered by the shutter plate 62, so is protected in the same way as above. As described above, according to the shutter plates 61 and 62 of the double-layer rotating shutter mechanism 54, when seen in the direction of the target from the substrate 34, only one target is exposed at the time of the sputtering. The targets not used for sputtering are covered by the shutter plates, so in this sense cross-contamination between targets is basically prevented.

In the multi-sputtering system explained in FIGS. 1, 2A, 2B, and 3, the example of providing four targets in each of the film-forming chambers 17A to 17C was explained, but the number of targets provided in a film-forming chamber is not limited to four and may be for example five or three as well. When the number of targets is five, the numbers of the holes formed in the shutter plates 61 and 62 of the double-layer rotating shutter mechanism 54 are suitably selected in accordance with the film-forming conditions. For example, the two shutter plates 61 and 62 are formed with two holes.

Further, in the multi-sputtering system, each layer of the multi-layer film deposited on the substrate 34 is formed by a single target substance by a single target, that is, single sputtering. A film may also be deposited, however, by using for example shutter plates 61 and 62 each formed with two holes and using two types of targets to deposit a mix of different target substances (also referred to as "co-sputtering").

Next, an embodiment of a double-layer shutter control method performed in a multi-sputtering system will be explained in detail. In the following explanation, the numbers and notations of the above targets will be suitably explained apart from the configuration of the multi-sputtering system explained above.

This double-layer shutter control method is designed to prevent the cross-contamination occurring in the complex relationship of the pre-sputtering and main sputtering etc. in addition to the basic action for preventing cross-contamination explained above. This double-layer shutter control method moves the two shutter plates 61 and 62 of the double-layer rotating shutter mechanism 54 explained above to select the target to be used according to the film-forming sequence of the multi-layer film to be formed on the substrate 34 and, at the same time, to prevent sputtering using a certain target from contaminating the other targets due to the state of discharge of the pre-sputtering and the state of discharge of the main sputtering during movement, that is, cross-contamination.

Figure 4:
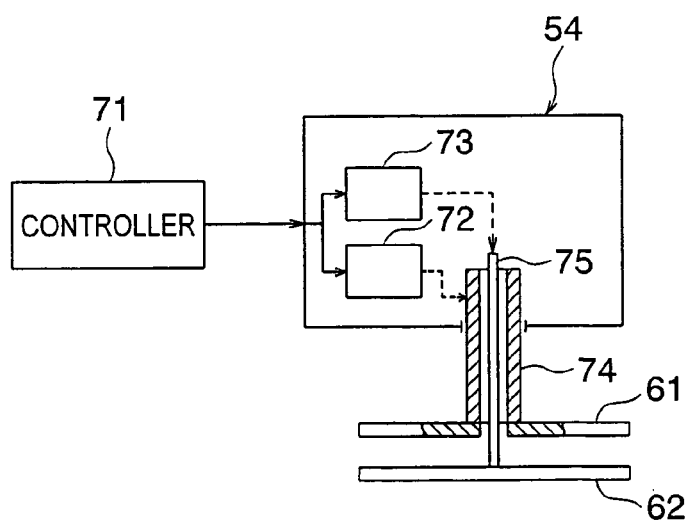
FIG. 4 is a view of the configuration showing the configuration of a control device for controlling the rotation operation of the double-layer rotating shutter mechanism.

The double-layer shutter control method described above is executed by independently controlling the rotation operations of the shutter plates 61 and 62 of the double-layer rotating shutter mechanism 54 by a controller 71 as shown in FIG. 4. The double-layer rotating shutter mechanism 54 is provided with drive units 72 and 73 for driving two shutter plates 61 and 62. The controller 71 individually controls the operations of the drive units 72 and 73. Shafts 74 and 75 of the shutter plates 61 and 62 are formed by for example a co-axial structure.

Figure 5:
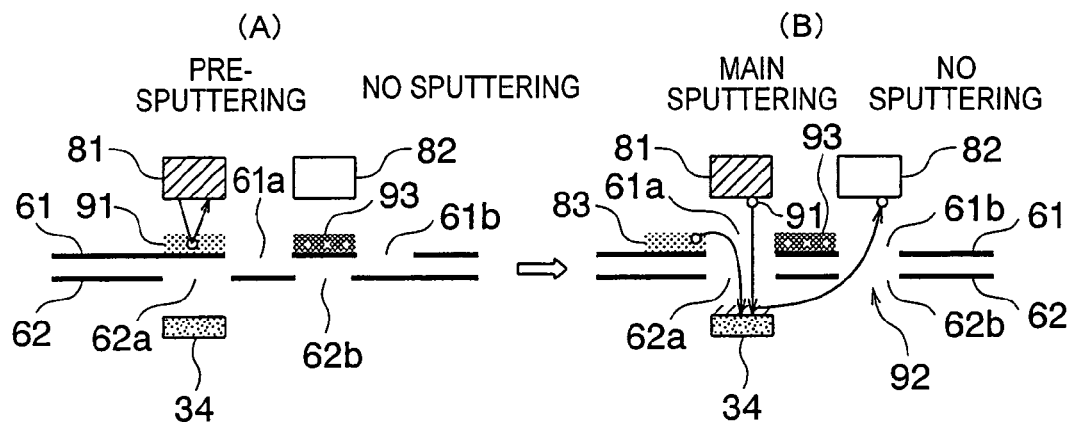
FIG. 5 is a view for explaining the cross-contamination regarded as the problem in the present invention.

Here, referring to FIG. 5, the phenomenon of the cross-contamination to be prevented by the double-layer shutter control method according to the present invention will be explained in more detail from the viewpoint of the phenomenon of deposition of the target substances on the shutter plates 61 and 62. In FIG. 5, (A) shows the time of the pre-sputtering, and (B) shows the time of the main sputtering. In FIG. 5, 81 is the target used for the sputtering, while 82 is another target not used for the sputtering located at the adjacent position. At the time of the pre-sputtering, the hole 62a of the shutter plate 62 is aligned with the target 81, then the target 81 is covered by the shutter plate 61. In this state, discharge is caused for the pre-sputtering. Note that, the power is not turned on and discharge is not caused for the target not used for the sputtering. In this example, the shutter plate 61 is formed with the two holes 61a and 61b, and the shutter plate 62 is formed with the two holes 62a and 62b.

In the operation of the double-layer rotating shutter mechanism 54 in conventional multi-sputtering, at the time of the pre-sputtering (A), since a state occurred where a substance 91 of the other target was deposited on the surface of the shutter plate 61 facing the target 81 (shutter deposit) due to for example the previous sputter operation, the target substance 91 was used for sputtering by the discharge at the time of the pre-sputtering and deposited onto the surface of the target 81. Accordingly, at the time of the main sputtering (B), the other target substance 91 deposited on the surface of the target 81 ends up being deposited on the surface of the substrate 34, so cross-contamination occurred. In (A), the shutter 61 is stationary since it is the time of pre-sputtering, but when shifting from (A) to (B), the same phenomenon also occurs when rotating and moving the shutter 61. Namely, the target 81 is subjected to continuous discharge from the pre-sputtering to the main sputtering, therefore, when a substance different from that of the target 81 is passed during rotation of the shutter 62, the same phenomenon as the above cross-contamination occurs. Further, the other target substance 91 and the substance 81 deposited on the substrate 34 are sometimes deposited on the adjacent target 82 through for example an opening portion 92. In this way, other cross-contamination also occurs. Note that, 93 is the shutter deposit of the other target.

The double-layer shutter control method according to the present invention is designed to prevent the above cross-contamination and will be explained in detail in the following embodiments.

One of the basic ideas of the double-layer shutter control method of the present invention is to cover the target by a location of the shutter plate where a target substance the same as that of the above target is deposited in the pre-sputtering immediately before the main sputtering (or to prevent a location where another different target substance is deposited from arriving a facing location during the shutter rotation operation) when using a certain target (for example, the target 81) for sputtering. According to another idea of the invention, a deposition prevention plate may be utilized to eliminate deposition of target substances at the peripheries of the holes of the shutter plate. Due to this, even if shutter deposit forms on the surface of the shutter plate at the target side at the time of pre-sputtering or even if the target for sputtering is formed with a deposit at the time of the main sputtering, since it is a material of the same type, the film deposited on the substrate is held at a high quality.

The basic configuration of the double-layer shutter control method according to the present invention will be explained next by referring to FIG. 6 and FIG. 7.

First, an explanation will be given of the phenomenon of deposition of the target substances on the shutter plates 61 and 62 in the double-layer shutter control method according to the present invention by referring to FIG. 6. In FIG. 6, (A) shows the time of pre-sputtering, and (B) shows the time of main sputtering. In FIG. 6, 81 is the target for the sputtering. In this multi-sputtering system, a deposition prevention plate 94 is arranged in the vicinity of the target surface of the target 81. The deposition prevention plate 94 is a member formed with a hole 94a, shields the space around the target 81, and exposes the target sputtering surface to the substrate side through the hole 94a. At the time of the pre-sputtering, the hole 62a of the shutter plate 62 is aligned with the target 81, and the target 81 is covered by the shutter plate 61. The pre-sputtering is carried out in this state. Based on the method of control explained later, a substance 81A of the target 81 is deposited on the facing surface of the shutter plate 61. Even if the target 81 is used for pre-sputtering, the same target substance is deposited onto the facing surface, so contamination does not occur. Further, at the time of main sputtering, the hole 61a of the shutter plate 61 is aligned with the target 81 as shown in (B) of FIG. 6, so the substance 81A of the target 81 is deposited onto the surface of the substrate 34. In this case as well, since the surface of the target 81 was not contaminated at the time of the pre-sputtering, cross-contamination does not occur. In FIG. 6, since the deposition prevention plate 94 is provided, the deposition of the target deposit on the peripheral edge 61a-1 of the hole 61a can be prevented.

Next, referring to FIG. 7, an explanation will be given of a situation the same as the situation explained in FIG. 5 in the case of sputtering according to the present invention. In FIG. 7, the same notations are assigned to components substantially the same as the components explained in FIG. 5. The difference between the case of FIG. 7 and the case of FIG. 5 is that the same substances 81a and 82a are deposited at locations facing the targets 81 and 82 at the stage of the pre-sputtering when using the target 81 for sputtering to form a film of the substance of the target 81 on the substrate 34. Further, only locations where the same substance is deposited are passed. Further, the target deposit is not deposited at the peripheral edge 61a-1 of the hole 61a. Still further, the stationary position of the shutter plate 62 differs. In the case of FIG. 5, at the time of the pre-sputtering, the hole 62a is aligned with the target 81 and the hole 62b is aligned with the target 82, but in the case of FIG. 7, at the time of the pre-sputtering, the hole 62b is aligned with the target 81 and the target 82 is covered. Therefore, according to the case of the sputtering of the present invention shown in FIG. 7, all of the cross-contamination explained in FIG. 5 can be reliably prevented.

Figure 6:
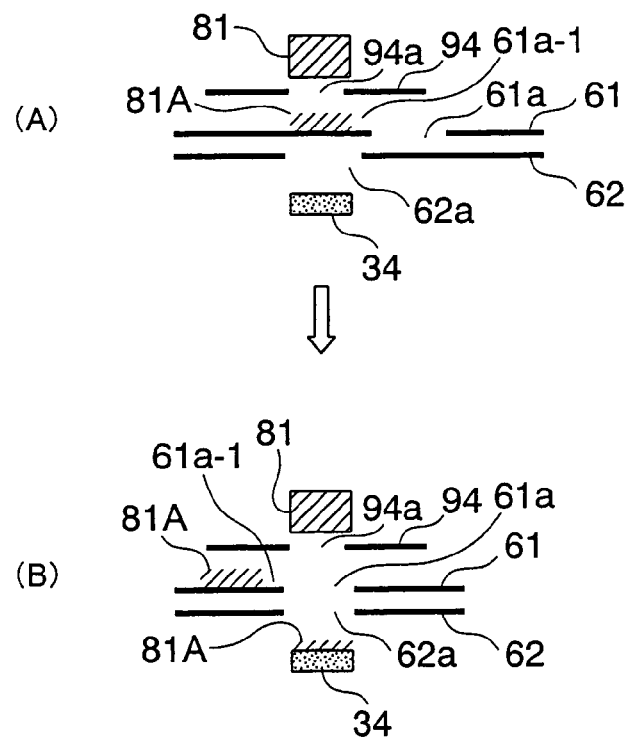
FIG. 6 is a view for explaining a basic operation of the double-layer shutter control method according to an embodiment of the present invention.
Figure 7:
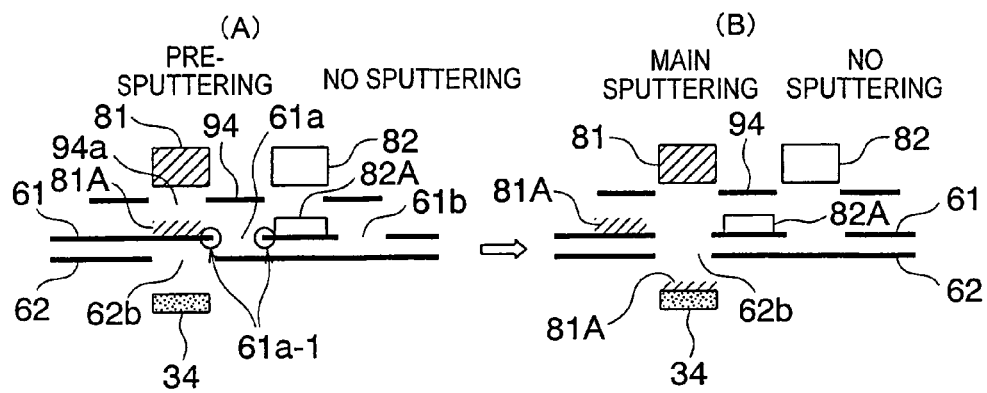
FIG. 7 is a view for explaining basic operations at the time of pre-sputtering and the time of main sputtering of the double-layer shutter control method according to the present invention.

When preventing the cross-contamination explained in FIG. 6 and FIG. 7 in sputtering utilizing the double-layer rotating shutter mechanism 54, the particularly important point is that a target substance the same as that of the target 81 is deposited on the location of the surface of the shutter plate 61 or the shutter plate 62 facing the target at the time of the pre-sputtering immediately before the main sputtering in sputtering using the target 81. When selecting a certain target among the plurality of targets for sputtering, the same substance is deposited at the location of the shutter plate 61 covering the selected target at the time of the pre-sputtering before the main sputtering. Namely, in order to create a relationship not depositing another target substance and in order to create a relationship not allowing a substance deposited by another target to pass in front of a certain target in the discharge state when shifting from pre-sputtering to main sputtering, the double-layer shutter control method explained below is used to control the rotation operations of the two shutter plates 61 and 62 of the double-layer rotating shutter mechanism 54.

Below, an explanation will be given of some typical embodiments of the method of control of the double-layer shutter mechanism in accordance with the number of the targets and the type of the sputtering (single sputtering and co-sputtering) according to the present invention.

First Embodiment

Figure 8:
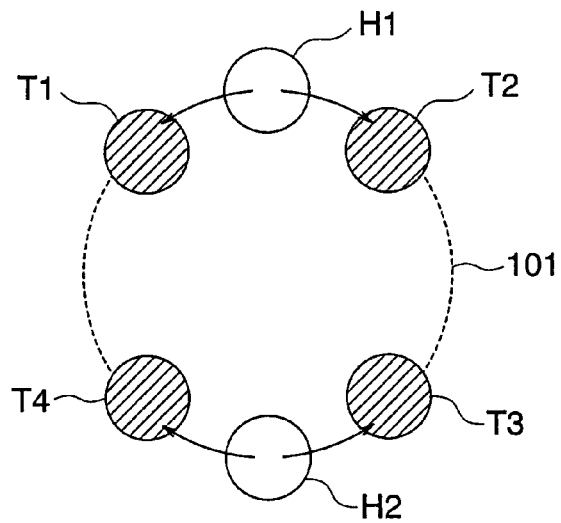
FIG. 8 is a view of the arrangement of targets of a first embodiment of the double-layer shutter control method according to an embodiment of the present invention.
Figure 9:
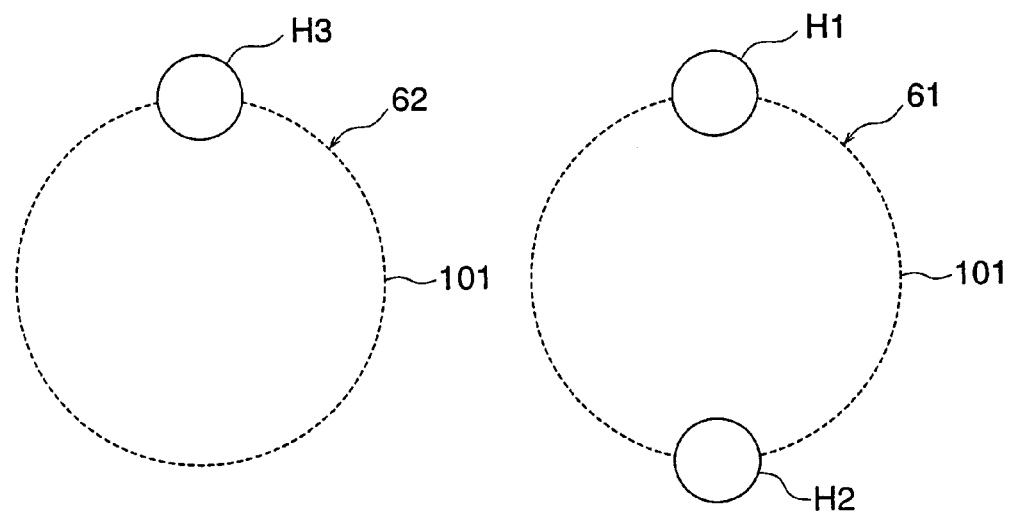
FIG. 9 is a view of the arrangement of holes of first and second shutter plates of the first embodiment of the double-layer shutter control method.

An explanation will be given of a first embodiment of the double-layer shutter control method by referring to FIG. 8 to FIG. 11. This first embodiment shows an example of four targets and single sputtering using a first shutter plate having two holes and a second shutter plate having one hole. The double-layer shutter control method according to the first embodiment is for the configuration of the system shown in FIG. 1 to FIG. 3. In FIG. 8 and FIG. 9, for convenience for conceptually explaining the embodiment, the four targets are indicated by the notations T1 to T4, the two holes of the first shutter plate 61 facing the target are indicated by the notations H1 and H2, and the single hole of the second shutter plate 62 on the substrate side is indicated by the notation H3.

The targets T1 to T4 correspond to the targets 35 to 38 shown in FIG. 3, the holes H1 and H2 correspond to the holes 61a and 61b, and the hole H3 corresponds to the hole 62a. In the first shutter plate 61, the two holes H1 and H2 are formed at positions 180° apart. Further, in FIG. 8 and FIG. 9, the circles 101 indicate the paths of movement of the holes H1 to H3 when the two shutter plates 61 and 62 rotate.

Figure 10:
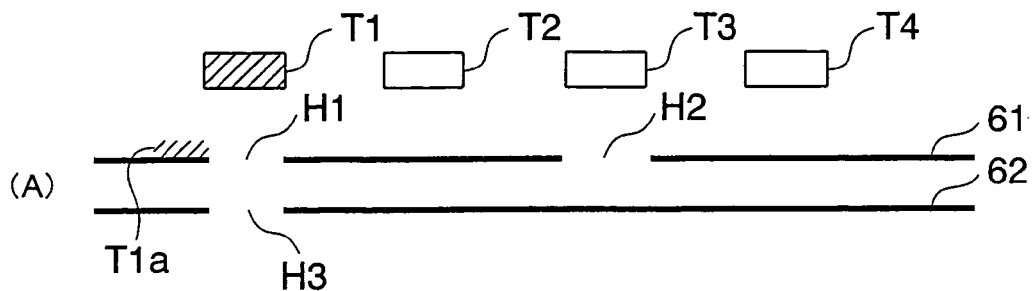
FIG. 10 is a state transition diagram showing the change of positions of the first and second shutter plates of the first embodiment of the double-layer shutter control method.
Figure 10:
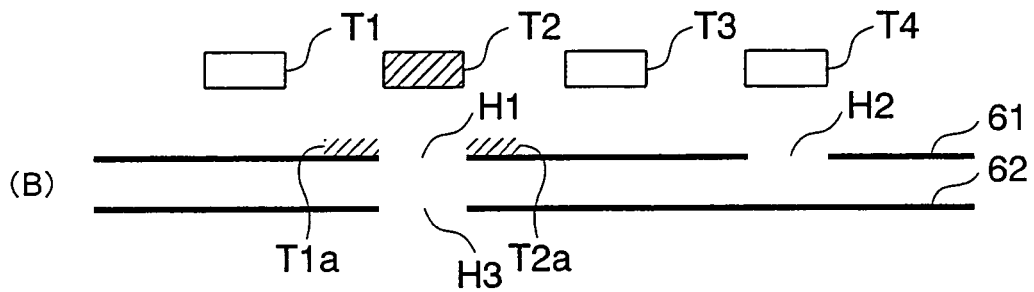
Figure 10:
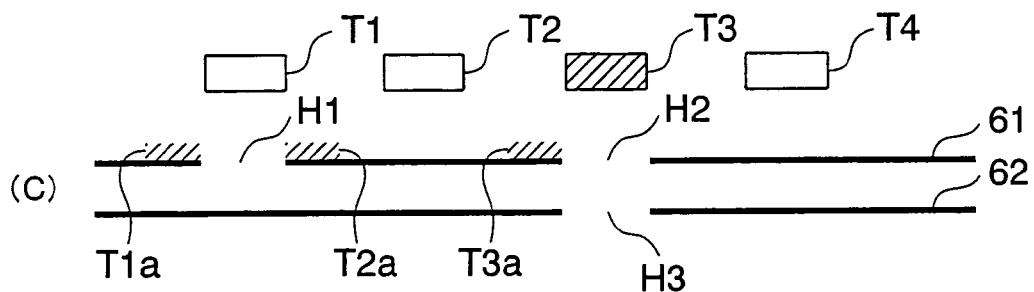
Figure 10:
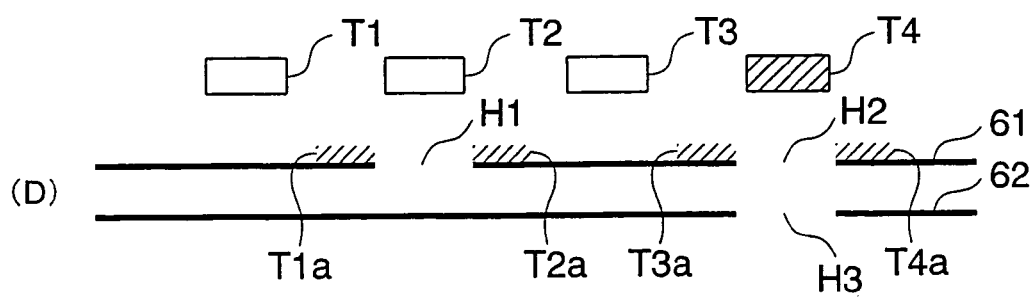

(A) to (D) of FIG. 10 show the positions of the rotation movement of the first shutter plate 61 and the second shutter plate 62 when sequentially using the four targets T1 to T4 for the main sputtering in the sequence of T1, T2, T3, and T4. In the following explanation, assume that the step of the pre-sputtering for a certain target is carried out before the step of the main sputtering. Further, power for the pre-sputtering and the main sputtering is supplied from the power source for every target for sputtering. The targets (T1 to T4) indicated by the hatched blocks in FIG. 10 are supplied with power and are in the discharge state, while the other targets indicated by simple blank blocks are not supplied with power and are in the non-discharge state. The meaning of the blocks representing the targets (T1 to T5) is the same in all embodiments explained below. Note that, in the first embodiment, in actuality, there are also cases performing the main sputtering by other sequences different from the sequence of T1, T2, T3, and T4.

(A) of FIG. 10 shows a state of using the target T1 for the main sputtering. A deposit T1a deposited on the surface of the first shutter plate 61 is comprised of the substances of the target T1 deposited at the stage of pre-sputtering before that.

Figure 11:
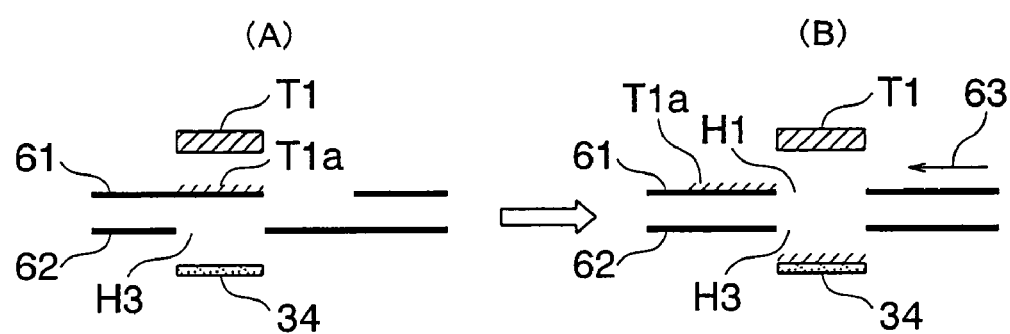
FIG. 11 is a state transition diagram showing the positional relationships of targets for sputtering and the first and second shutter plates at the time of the main sputtering.

In FIG. 11, as an example, the relationship between the pre-sputtering (A) and the main sputtering (B) is shown for the target T1. Control is performed so that the hole H3 of the second shutter plate 62 is aligned with the target T1 and the first shutter plate 61 is covered at the time of the pre-sputtering. When shifting from the pre-sputtering to the main sputtering, the first shutter plate 61 rotates as indicated by an arrow 63 so that the hole H1 is aligned with the target T1 to expose the target T1 with respect to the substrate 34. In this state, at the location of the first shutter plate 61 facing the target T1, there is only the deposit T1a formed by depositing the same substance.

Accordingly, as shown in (A) of FIG. 10, the rotation operation of the first shutter plate 61 is controlled so that the location of the deposit T1a faces the target T1 at the time of the pre-sputtering. In the main sputtering for the target T1, the hole H3 of the second shutter plate 62 is aligned with the target T1 at the time of the pre-sputtering, then the first shutter plate 61 on which the deposit T1a is deposited is rotated so that the hole H1 thereof is aligned with the target T1. Due to this, the hole H1 of the first shutter plate 61 and the hole H3 of the second shutter plate 62 are aligned to expose the target T1 with respect to the substrate 34 and perform the main sputtering. In the above description, only the deposit T1a passes through a location frontally facing the target T1 due to the rotation operation of the first shutter plate 61 from the pre-sputtering state to the main sputtering state while maintaining the discharge state. For this reason, cross-contamination can be prevented. Note that no other target substance passes through a location frontally facing the target T1 due to the rotation operation of the first shutter plate 61 from the pre-sputtering state to the main sputtering state.

(B) of FIG. 10 shows the state of next using the target T2 for the main sputtering. Deposits T1a and T2a deposited on the surface of the first shutter plate 61 are comprised of the substances of the targets T1 and T2 deposited at stages of pre-sputtering etc. before that. When using the target T2 for the main sputtering, the hole H3 of the second shutter plate 62 is aligned with the target T2 at the time of the pre-sputtering, then the first shutter plate 61 on which the deposits T1a and T2a are deposited is rotated so that the hole H1 is aligned with the target T2. Due to this, the hole H1 of the first shutter plate 61 and the hole H3 of the second shutter plate 62 are aligned to expose the target T2 with respect to the substrate and perform the main sputtering. In the above description, only the deposit T2a passes through a location frontally facing the target T2 due to the rotation operation of the first shutter plate 61 from the pre-sputtering state to the main sputtering state while maintaining the discharge state. No other target substance passes through it. For this reason, cross-contamination can be prevented at the target T2 and the other targets T1, T3, and T4.

(C) of FIG. 10 shows the state of next using the target T3 for the main sputtering. Deposits T1a, T2a, and T3a deposited on the surface of the first shutter plate 61 are comprised of substances of the targets T1 to T3 deposited at stages of pre-sputtering etc. before that. When using the target T3 for the main sputtering, the hole H3 of the second shutter plate 62 is aligned with the target T3 at the time of the pre-sputtering, then the first shutter plate 61 on which the deposits T1a to T3a are deposited is rotated so that the hole H2 thereof is aligned with the target T3. Due to this, the hole H2 of the first shutter plate 61 and the hole H3 of the second shutter plate 62 are aligned to expose the target T3 with respect to the substrate and perform the main sputtering. In the above description, only the deposit T3a passes through a location frontally facing the target T3 due to the rotation operation of the first shutter plate 61 from the pre-sputtering state to the main sputtering state while maintaining the discharge state. No other target substance passes through it. For this reason, the above cross-contamination can be prevented at the target T3 and the other targets T1, T2, and T4.

(D) of FIG. 10 shows the state of next using the target T4 for the main sputtering. Deposits T1a, T2a, T3a, and T4a deposited on the surface of the first shutter plate 61 are comprised of substances of the targets T1 to T4 deposited at stages of pre-sputtering etc. before that. When using the target T4 for the main sputtering, the hole H3 of the second shutter plate 62 is aligned with the target T4 at the time of the pre-sputtering, then the first shutter plate 61 on which the deposits T1a to T4a are deposited is rotated so that the hole H2 is aligned with the target T4. Due to this, the hole H2 of the first shutter plate 61 and the hole H3 of the second shutter plate 62 are aligned to expose the target T4 with respect to the substrate and perform the main sputtering. In the above description, only the deposit T4a passes through a location frontally facing the target T4 due to the rotation operation of the first shutter plate 61 from the pre-sputtering state to the main sputtering state while maintaining the discharge state. No other target substance passes through it. For this reason, the above cross-contamination can be prevented at the target T4 and the other targets T1, T2, and T3.

Next, an explanation will be given of embodiments of a double-layer shutter control method in the case of five targets and each of the first shutter plate and the second shutter plate having two holes and able to perform "single sputtering control" and "co-sputtering control" using a common system configuration of one film-forming chamber of the multi-sputtering system. In the explanation of these embodiments, an example of the co-sputtering control will be explained as a second embodiment first, then an example of single sputtering control performed after co-sputtering control will be explained as a third embodiment.

Second Embodiment

A second embodiment of a double-layer shutter control method will be explained by referring to FIG. 12, FIG. 13, and FIG. 14A to FIG. 14D. This second embodiment shows an example of five targets, a first shutter plate and a second shutter plate each having two holes, and co-sputtering.

Figure 12:
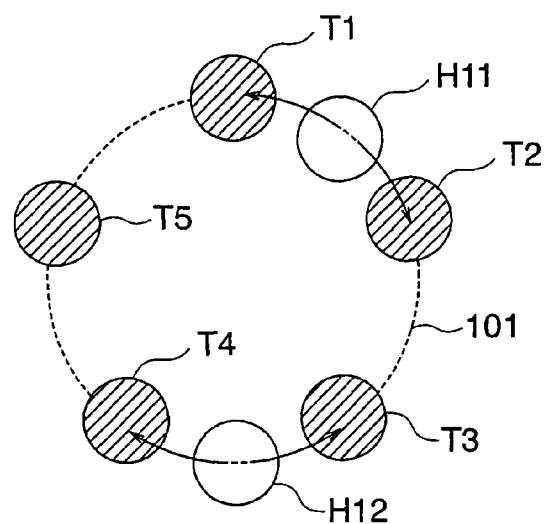
FIG. 12 is a view of the arrangement of targets of a second embodiment of the double-layer shutter control method according to the present invention.
Figure 13:
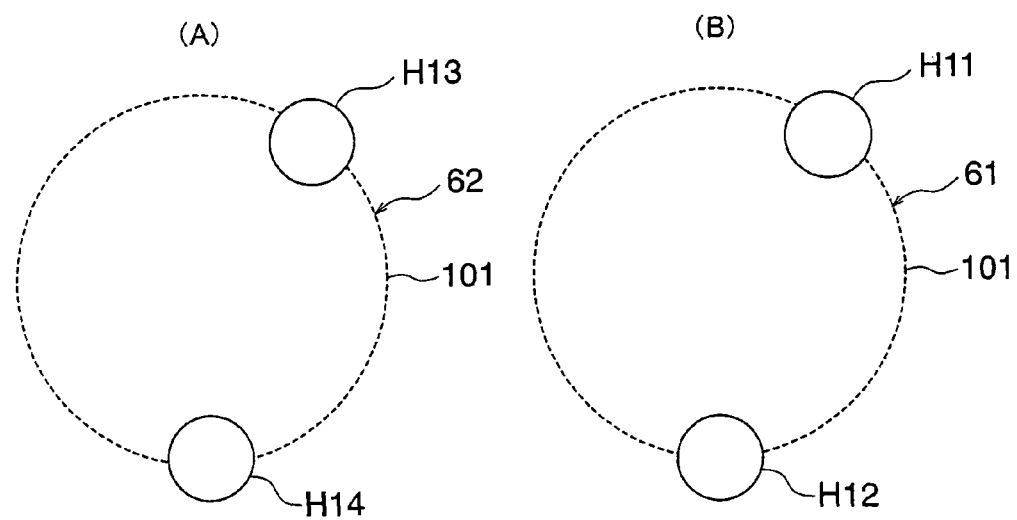
FIG. 13 is a view of the arrangement of holes of the first and second shutter plates of the second embodiment of the double-layer shutter control method.

In FIG. 12 and FIG. 13, the five targets are indicated by the notations T1 to T5, the two holes of the first shutter plate 61 facing the target are indicated by the notations H11 and H12, and the two holes of the second shutter plate 62 on the substrate side are indicated by the notations H13 and H14. The holes H11 and H12 in the first shutter plate 61 are formed at positions 144° apart in the clockwise direction, while the holes H13 and H14 in the second shutter plate 62 are formed at positions 144° apart in the clockwise direction. Further, in FIG. 12 and FIG. 13, the circles 101 indicate the paths of movement of the holes H11 to H14 when the shutter plates 61 and 62 rotate.

FIG. 14A to FIG. 14D show the positions of rotation movement of the first shutter plate 61 and the second shutter plate 62 when sequentially performing the co-sputtering of the targets T1 and T3, the co-sputtering of the targets T2 and T4, the co-sputtering of the targets T1 and T4, and the co-sputtering of the targets T2 and T5 based on the five targets T1 to T5. In each of FIG. 14A to FIG. 14D, the upper part (A) shows the state in the pre-sputtering, and the lower part (B) shows the state in the main sputtering. By the movement of the first shutter plate 61 or the second shutter plate 62 from the positions in the pre-sputtering, the system is shifted to the state for the main sputtering.

Note that, in the co-sputtering for the five targets T1 to T5, with the present system configuration, co-sputtering between adjacent targets is not possible due to the connection of the sputter power and the limitations of the shutter holes. Based on this rule, the four sets of co-sputtering of the targets T1 and T3, the targets T2 and T4, the targets T1 and T4, and the targets T2 and T5 are carried out as described above.

Figure 14A:
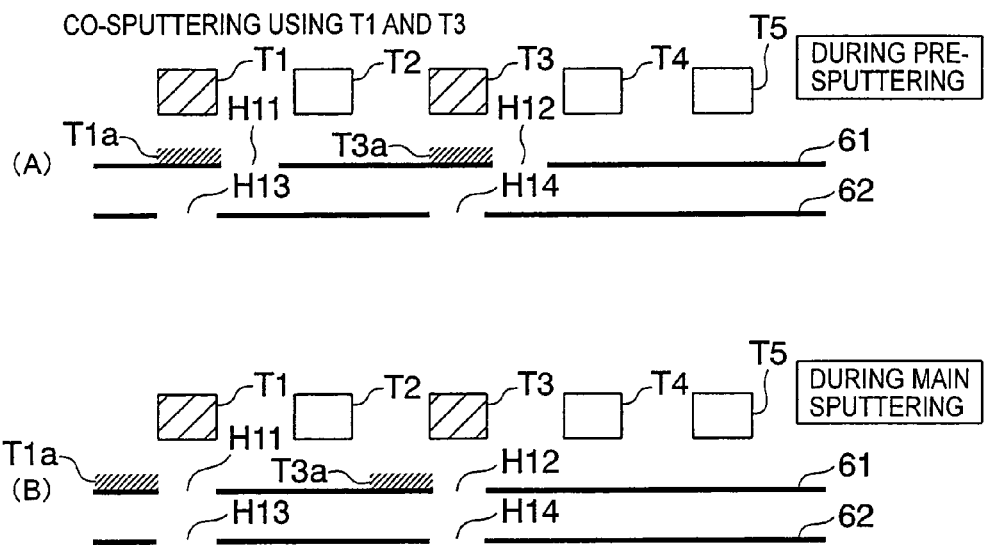
FIG. 14A is a state transition diagram showing the change of positions of the first and second shutter plates when co-sputtering using targets T1 and T3 in the second embodiment.

FIG. 14A shows a state of using the two targets T1 and T3 for co-sputtering first. In an initial state, no film is deposited on either of the first shutter plate 61 or the second shutter plate 62. For co-sputtering using the targets T1 and T3, power is supplied to each of the targets T1 and T3 from the power source to create a discharge state only for the targets T1 and T3.

In FIG. 14A, the targets T1 and T3 indicated by the hatched blocks are in the discharge state, while the targets T2, T4, and T5 indicated by the blank blocks are in the non-discharge state. Based on the discharge state in the pre-sputtering, deposits T1a and T3a are deposited on the surface of the first shutter plate 61. The deposits T1a and T3a are comprised of the substances of targets T1 and T3 deposited at the locations facing the targets T1 and T3 in the discharge state during the pre-sputtering.

As shown in FIG. 14A, at the time of the pre-sputtering, the rotation operation of the first shutter plate 61 is controlled so as to align the hole H11 with a position between the targets T1 and T2 and align the hole H12 with the targets T3 and T4. Further, at the time of the pre-sputtering, the rotation operation of the second shutter plate 62 is controlled so as to align the hole H13 with the target T1 and align the hole H14 with the target T3. There is no deposit on the surface of the second shutter plate 61.

Next, when using the targets T1 and T3 for sputtering, the first shutter plate 61 on which the deposits T1a and T3a are deposited is rotated so that the holes H11 and H12 are aligned with the targets T1 and T3. Due to this, the hole H11 of the first shutter plate 61 and the hole H13 of the second shutter plate 62 are aligned, the hole H12 of the first shutter plate 61 and the hole H14 of the second shutter plate 62 are aligned, and the target T1 and the target T3 are exposed with respect to the substrate to perform the main sputtering.

In the above description, when the first shutter plate 61 is rotated from the pre-sputtering state to the main sputtering state while maintaining the discharge, only the deposits T1a and T3a pass through locations frontally facing the targets T1 and T3. For this reason, the cross-contamination explained above can be prevented.

Figure 14B:
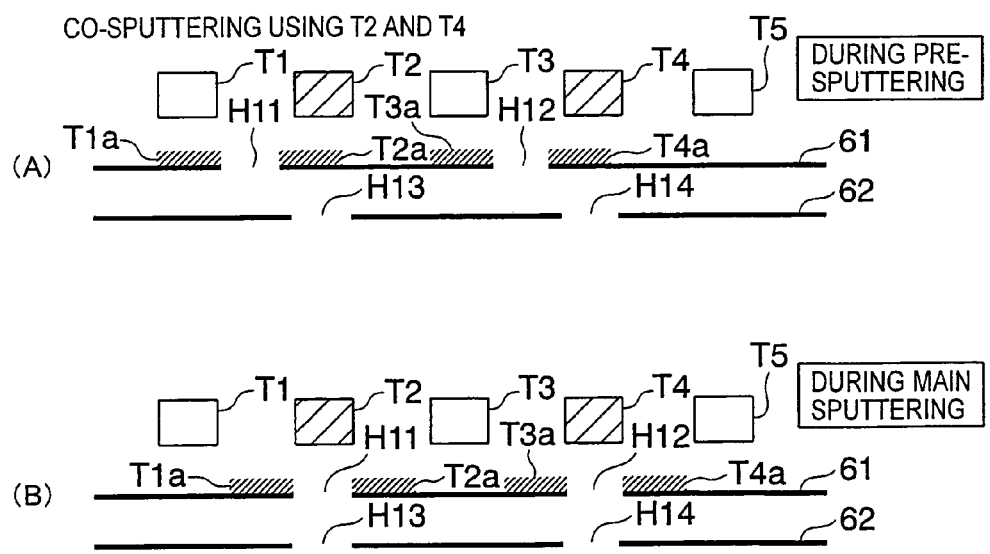
FIG. 14B is a state transition diagram showing the change of positions of the first and second shutter plates when co-sputtering using targets T2 and T4 in the second embodiment.

FIG. 14B shows the state of the case of next using the targets T2 and T4 for co-sputtering after the end of the main sputtering shown in FIG. 14A. In this case, the targets T2 and T4 are in the discharge state, and the targets T1, T3, and T5 are in the non-discharge state. Further, in this case, at the time of the pre-sputtering, the rotation operation of the first shutter plate 61 is controlled again so as to align the hole H11 with a position between the targets T1 and T2 and align the hole H12 with a position between the targets T3 and T4, and the rotation operation of the second shutter plate 62 is controlled so as to align the hole H13 with the target T2 and align the hole H14 with the target T4. There is no deposit on the surface of the second shutter plate 62.

On the surface of the first shutter plate 61, deposits T2a and T4a are newly deposited by the pre-sputtering. The deposits T1a to T4a are comprised of substances of the targets T1 to T4 deposited at the previous stage of the co-sputtering and the current pre-sputtering. When using the targets T2 and T4 for the main sputtering, the first shutter plate 61 on which the deposits T1a to T4a were deposited in the state where the holes H13 and H14 of the second shutter plate 62 were aligned with the targets T2 and T4 at the time of the pre-sputtering is rotated so that the holes H11 and H12 are aligned with the targets T2 and T4. Due to this, the holes H11 and H12 of the first shutter plate 61 and the holes H13 and H14 of the second shutter plate 62 are aligned to expose the targets T2 and T4 with respect to the substrate and perform the main sputtering.

In the above description, when rotating the first shutter plate 61 from the pre-sputtering state to the main sputtering state while maintaining the discharge, only the deposits T2a and T4a pass through locations frontally facing the targets T2 and T4. For this reason, the cross-contamination explained above can be prevented at the targets T2 and T4.

Figure 14C:
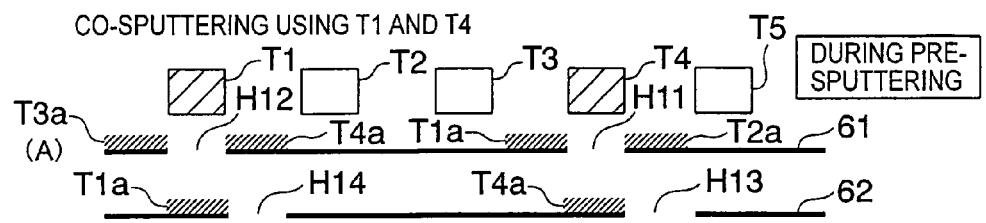
FIG. 14C is a state transition diagram showing the change of positions of the first and second shutter plates when co-sputtering using targets T1 and T4 in the second embodiment.
Figure 14C:
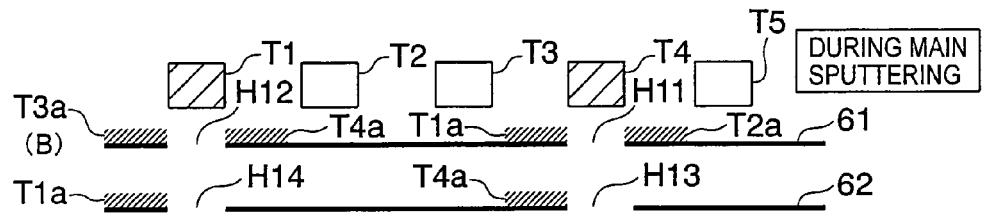

FIG. 14C shows a state of a case of next using the targets T1 and T4 for co-sputtering after the end of the main sputtering shown in FIG. 14B. In this case, the targets T1 and T4 are in the discharge state, while the targets T2, T3, and T5 are in the non-discharge state. Further, in this case, at the time of the pre-sputtering, the rotation operation of the first shutter plate 61 is controlled so as to align the hole H12 with the target T1 and align the hole H11 with the target T4, while the rotation operation of the second shutter plate 62 is controlled so as to align the hole H14 with a position between the targets T1 and T2 and align the hole H13 with a position between the targets T4 and T5. Deposits T1a to T4a deposited on the surface of the first shutter plate 61 are comprised of the substances of the targets T1 to T4 deposited at the stages of the pre-sputtering etc. before that. Further, the deposits T1a and T4a are formed on the surface of the second shutter plate 62 by the current pre-sputtering.

When using the targets T1 and T4 for the main sputtering, next the second shutter plate 62 on which the deposits T1a and T4a are deposited is rotated so that the holes H14 and H13 thereof are aligned with the targets T1 and T4. Due to this, the holes H12 and H11 of the first shutter plate 61 and the holes H14 and H13 of the second shutter plate 62 are aligned to expose the targets T1 and T4 with respect to the substrate and perform the main sputtering.

In the above description, when rotating the first shutter plate 61 from the pre-sputtering state to the main sputtering state while maintaining the discharge, only the deposits T1a and T4a pass through locations frontally facing the targets T1 and T4. For this reason, the cross-contamination explained above can be prevented at the targets T1 and T4.

Figure 14D:
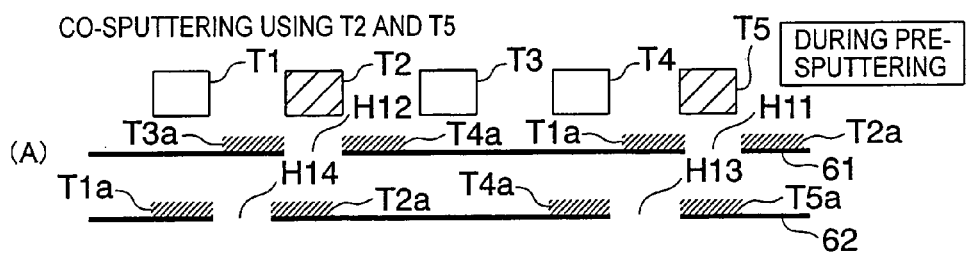
FIG. 14D is a state transition diagram showing the change of positions of the first and second shutter plates when co-sputtering using targets T2 and T5 in the second embodiment.
Figure 14D:
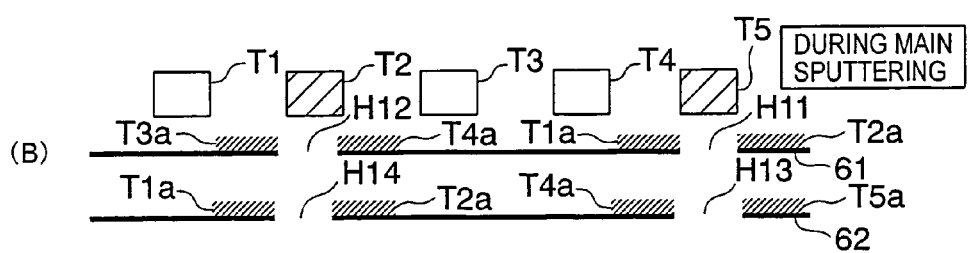

FIG. 14D shows a state of a case of next using the targets T2 and T5 for co-sputtering after the end of the main sputtering shown in FIG. 14C. In this case, the targets T2 and T5 are in the discharge state, while the targets T1, T3, and T4 are in the non-discharge state. Further, in this case, at the time of the pre-sputtering, the rotation operation of the first shutter plate 61 is controlled so as to align the hole H12 with the target T2 and align the hole H11 with the target T5, while the rotation operation of the second shutter plate 62 is controlled so as to align the hole H14 with a position between the targets T1 and T2 and align the hole H13 with a position between the targets T4 and T5. Deposits T1a to T4a deposited on the surface of the first shutter plate 61 are comprised of substances of the targets T1 to T4 deposited at stages of the pre-sputtering etc. before that. Further, deposits T2a and T5a are formed on the surface of the second shutter plate 62 by the current pre-sputtering in addition to the deposits T1a and T4a.

When using the targets T2 and T5 for the main sputtering, next the second shutter plate 62 on which the deposits T1a, T2a, T4a, and T5a are deposited is rotated so that the holes H14 and H13 thereof are aligned with the targets T2 and T5. Due to this, the holes H12 and H11 of the first shutter plate 61 and the holes H14 and H13 of the second shutter plate 62 are aligned to expose the targets T2 and T5 with respect to the substrate and perform the main sputtering.

In the above description, when rotating the first shutter plate 61 from the pre-sputtering state to the main sputtering state while maintaining the discharge, only the deposits T2a and T5a pass through locations frontally facing the targets T2 and T5. For this reason, the cross-contamination explained above can be prevented at the targets T2 and T5.

Third Embodiment

Next, a third embodiment of the double-layer shutter control method will be explained by referring to FIG. 15A to FIG. 15E. This third embodiment is a method of a single sputtering control using the same system configuration as that of the second embodiment explained by FIG. 12 and FIG. 13 which performs the single sputtering after the co-sputtering of the second embodiment. Accordingly, the double-layer shutter control method of the third embodiment shows an example of five targets, first and second shutter plates each having two holes, and single sputtering. Further, in the single sputtering according to the third embodiment, the pre-sputtering is performed utilizing the position where the film is finally deposited at the time when the final main sputtering in the second embodiment ends (the film deposition position at the time of the main sputtering of FIG. 14D).

In FIG. 15A to FIG. 15E, the five targets T1 to T5, the two holes H11 and H12 of the first shutter plate 61 facing the targets, and the two holes H13 and H14 of the shutter plate 62 on the substrate side are the same as those of the case of the second embodiment.

FIG. 15A to FIG. 15E show the positions of rotation movement of the first shutter plate 61 and the second shutter plate 62 when sequentially perform single sputtering for the five targets T1 to T5 in the sequence of T1, T2, T3, T4, and T5. In each of FIG. 15A to FIG. 15E, the upper part (A) shows the state in the pre-sputtering, and the lower part (B) shows the state in the main sputtering.

Figure 15A:
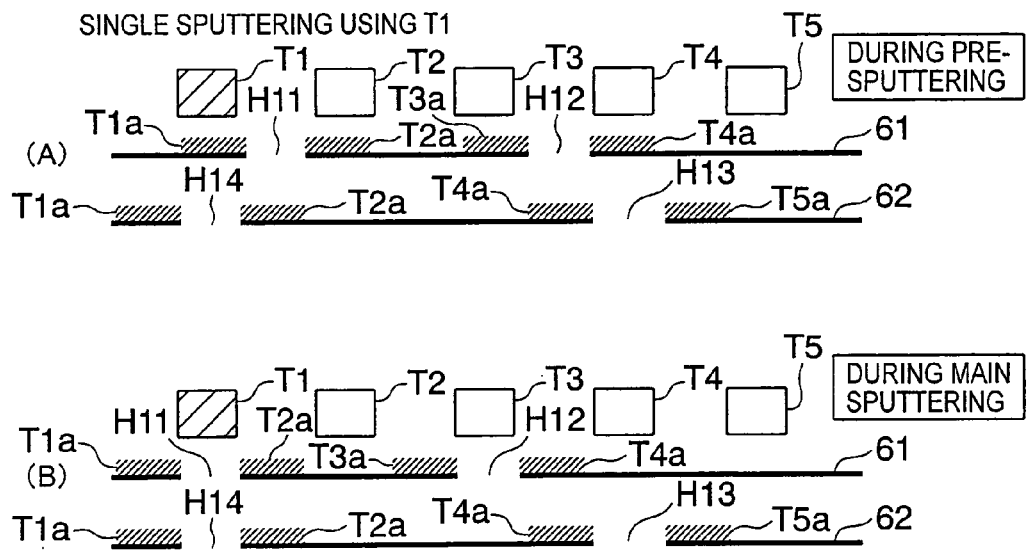
FIG. 15A is a state transition diagram showing the change of positions of the first and second shutter plates when single sputtering using the target T1 in a third embodiment of the double-layer shutter control method according to the present invention.

FIG. 15A shows a state of using the target T1 for single sputtering after the end of the main sputtering shown in FIG. 14D. In this case, the target T1 is in the discharge state, while the targets T2 to T5 are in the non-discharge state. Further, in this case, at the time of pre-sputtering, the rotation operation of the first shutter plate 61 is controlled so as to align the hole H11 with a position between the targets T1 and T2 and align the hole H12 with a position between the targets T3 and T4, while the rotation operation of the second shutter plate 62 is controlled so as to align the hole H14 with the target T1 and align the hole H13 with the target T4.

The deposits T1a, T2a, T3a, and T4a deposited on the surface of the first shutter plate 61 are comprised of the substances of the targets T1 to T4 deposited at locations facing the targets T1 to T4 in the discharge state at the stage of pre-sputtering etc. as previously explained. Further, the deposits T1a, T2a, T4a, and T5a deposited on the surface of the second shutter plate 62 are comprised of substances of the targets T1, T2, T4, and T5 deposited at locations facing the targets T1, T2, T4, and T5 in the discharge state at the previous stages of discharge.

As shown in FIG. 15A, at the time of the pre-sputtering, the rotation operation of the first shutter plate 61 is controlled so as to make the locations of the deposits T1a to T4a face the targets T1 to T4. Further, at the time of the pre-sputtering, the rotation operation of the second shutter plate 62 is controlled so as to align the hole H14 with the target T1 and align the hole H13 with the target T4.

Next, when using the target T1 for the main sputtering, next the first shutter plate 61 on which the deposits T1a to T4a are deposited is rotated to align the hole H11 with the target T1. Due this, the hole H11 of the first shutter plate 61 and the hole H14 of the second shutter plate 62 are aligned to expose the target T1 with respect to the substrate and perform the main sputtering.

In the above description, when the first shutter plate 61 rotates from the pre-sputtering state to the main sputtering state while maintaining the discharge, only the deposit T1a passes through a location frontally facing the target T1. No other target substance passes through it. For this reason, the cross-contamination explained above can be prevented.

Figure 15B:
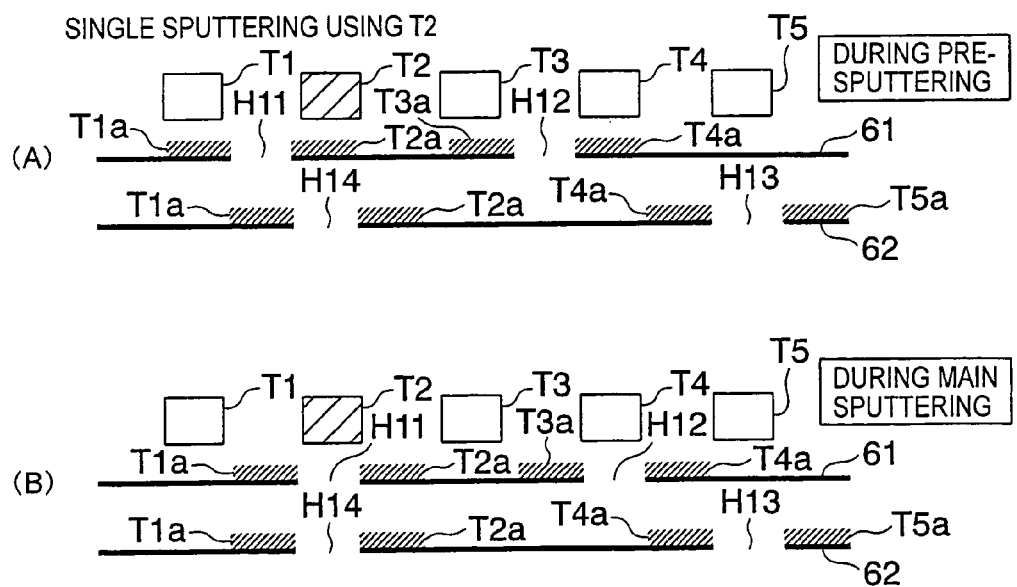
FIG. 15B is a state transition diagram showing the change of positions of the first and second shutter plates when single sputtering using the target T2 in the third embodiment.

FIG. 15B shows a state of next using the target T2 for single sputtering after the end of the main sputtering shown in FIG. 15A. In this case, the target T2 is in the discharge state, while the targets T1, and T3 to T5 are in the non-discharge state. Further, in this case, at the time of the pre-sputtering, the rotation operation of the first shutter plate 61 is controlled so as to align the hole H11 with a position between the targets T1 and T2 and align the hole H12 with a position between the targets T3 and T4, while the rotation operation of the second shutter plate 62 is controlled so as to align the hole H14 with the target T2 and align the hole H13 with the target T5.

The deposits T1a, T2a, T3a, and T4a deposited on the surface of the first shutter plate 61 are comprised of the substances of the targets T1 to T4 deposited at stages of the pre-sputtering etc. as previously explained. When using the target T2 for the main sputtering, the first shutter plate 61 on which the deposits T1a to T4a are deposited is rotated so that the hole H11 thereof is aligned with the target T2. Due to this, the hole H11 of the first shutter plate 61 and the hole H14 of the second shutter plate 62 are aligned to expose the target T2 with respect to the substrate and perform the main sputtering.

In the above description, when the first shutter plate 61 rotates from the pre-sputtering state to the main sputtering state while maintaining the discharge, only the deposit T2a passes through a location frontally facing the target T2. For this reason, the cross-contamination explained above can be prevented at the target T2.

Figure 15C:
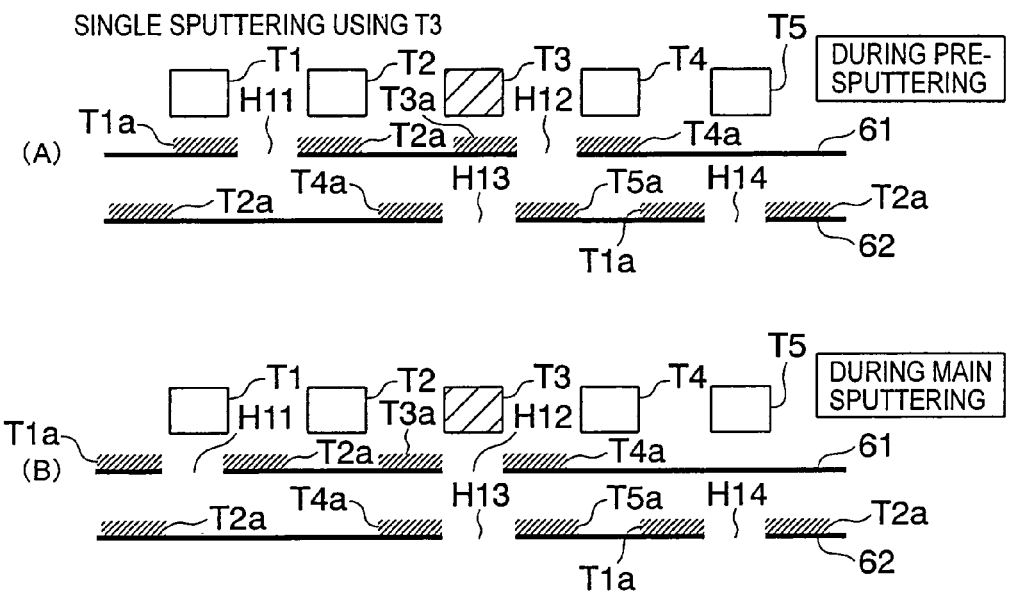
FIG. 15C is a state transition diagram showing the change of positions of the first and second shutter plates when single sputtering using the target T3 in the third embodiment.

FIG. 15C shows a state of next using the target T3 for single sputtering after the end of the main sputtering shown in FIG. 15B. In this case, the target T3 is in the discharge state, while the targets T1, T2, T4, and T5 are in the non-discharge state. Further, in this case, at the time of the pre-sputtering, the rotation operation of the first shutter plate 61 is controlled so as to align the hole H11 with a position between the targets T1 and T2 and align the hole H12 with a position between the targets T3 and T4, while the rotation operation of the second shutter plate 62 is controlled so as to align the hole H13 with the target T3 and align the hole H14 with the target T5.

The deposits T1a, T2a, T3a, and T4a deposited on the surface of the first shutter plate 61 are comprised of the substances of the targets T1 to T4 deposited at stages of the pre-sputtering etc. before that. When using the target T3 for the main sputtering, the first shutter plate 61 on which the deposits T1a to T4a are deposited is rotated so that the hole H12 thereof is aligned with the target T3. Due to this, the hole H12 of the first shutter plate 61 and the hole H13 of the second shutter plate 62 are aligned to expose the target T3 with respect to the substrate and perform the main sputtering.

In the above description, when the first shutter plate 61 rotates from the pre-sputtering state to the main sputtering state while maintaining the discharge, only the deposit T3a passes through a location frontally facing the target T3. For this reason, the cross-contamination explained above can be prevented at the target T3.

Figure 15D:
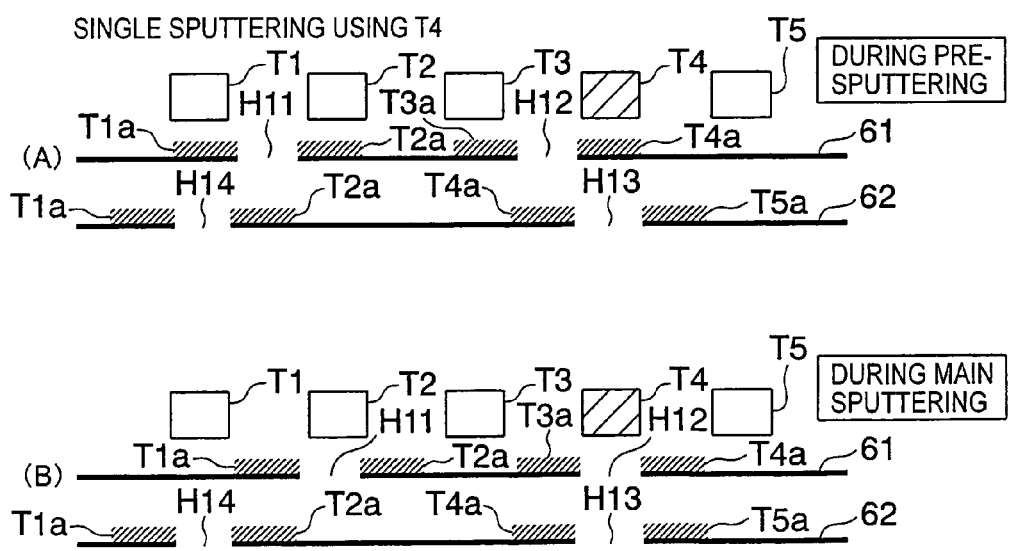
FIG. 15D is a state transition diagram showing the change of positions of the first and second shutter plates when single sputtering using the target T4 in the third embodiment.

FIG. 15D shows a state of next using the target T4 for single sputtering after the end of the main sputtering shown in FIG. 15C. In this case, the target T4 is in the discharge state, while the targets T1 to T3 and T5 are in the non-discharge state. Further, in this case, at the time of the pre-sputtering, the rotation operation of the first shutter plate 61 is controlled so as to align the hole H11 with a position between the targets T1 and T2 and align the hole H12 with a position between the targets T3 and T4, while the rotation operation of the second shutter plate 62 is controlled so as to align the hole H13 with the target T3 and align the hole H14 with the target T1.

The deposits T1a, T2a, T3a, and T4a deposited on the surface of the first shutter plate 61 are comprised of the substances of the targets T1 to T4 deposited at stages of the pre-sputtering etc. before that. When using the target T4 for the main sputtering, the first shutter plate 61 on which the deposits T1a to T4a are deposited is rotated so that the hole H12 thereof is aligned with the target T4. Due to this, the hole H12 of the first shutter plate 61 and the hole H13 of the second shutter plate 62 are aligned to expose the target T4 with respect to the substrate and perform the main sputtering.

In the above description, when the first shutter plate 61 rotates from the pre-sputtering state to the main sputtering state while maintaining the discharge, only the deposit T4a passes through a location frontally facing the target T4. For this reason, the cross-contamination explained above can be prevented at the target T4.

Figure 15E:
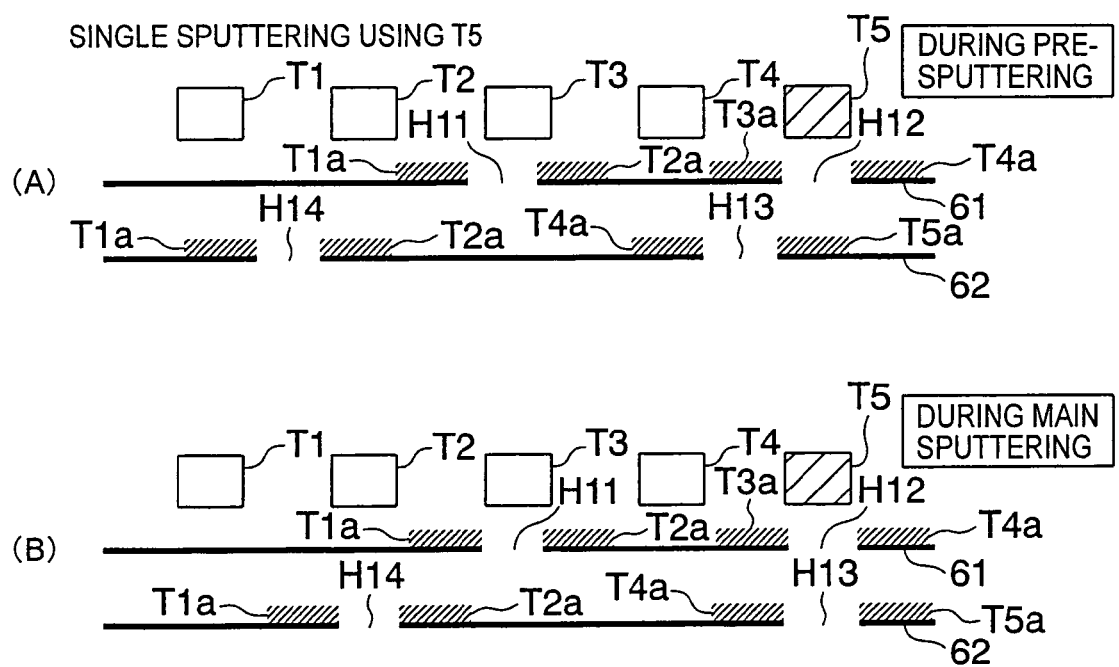
FIG. 15E is a state transition diagram showing the change of positions of the first and second shutter plates when single sputtering using the target T5 in the third embodiment.

FIG. 15E shows a state of next using the target T5 for single sputtering after the end of the main sputtering shown in FIG. 15D. In this case, the target T5 is in the discharge state, while the targets T1 to T4 are in the non-discharge state. Further, in this case, at the time of the pre-sputtering, the rotation operation of the first shutter plate 61 is controlled so as to align the hole H11 with the target T3 and align the hole H12 with the target T5, while the rotation operation of the second shutter plate 62 is controlled so as to align the hole H13 with a position between the targets T4 and T5 and align the hole H14 with a position between the targets T1 and T2.

The deposits T1a, T2a, T3a, and T4a deposited on the surface of the first shutter plate 61 are comprised of the substances of the targets T1 to T4 deposited at the stages of the pre-sputtering etc. before that. When using the target T5 for the main sputtering, the second shutter plate 62 is rotated so that the hole H13 thereof is aligned with the target T5. Due to this, the hole H12 of the first shutter plate 61 and the hole H13 of the second shutter plate 62 are aligned to expose the target T5 with respect to the substrate and perform the main sputtering.

In the above description, when the second shutter plate 62 rotates from the pre-sputtering state to the main sputtering state while maintaining the discharge, only the deposit T5a passes through a location frontally facing the target T5. For this reason, the cross-contamination explained above can be prevented at the target T5.

Fourth Embodiment

Figure 16:
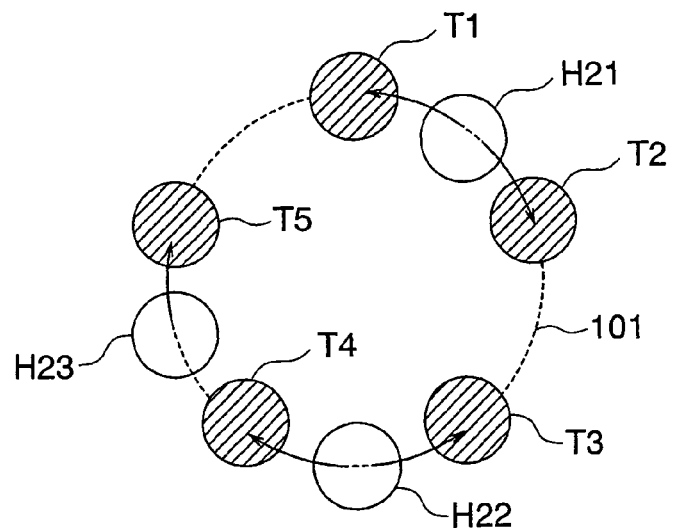
FIG. 16 is a view of the arrangement of targets of a fourth embodiment of the double-layer shutter control method according to the present invention.
Figure 17:
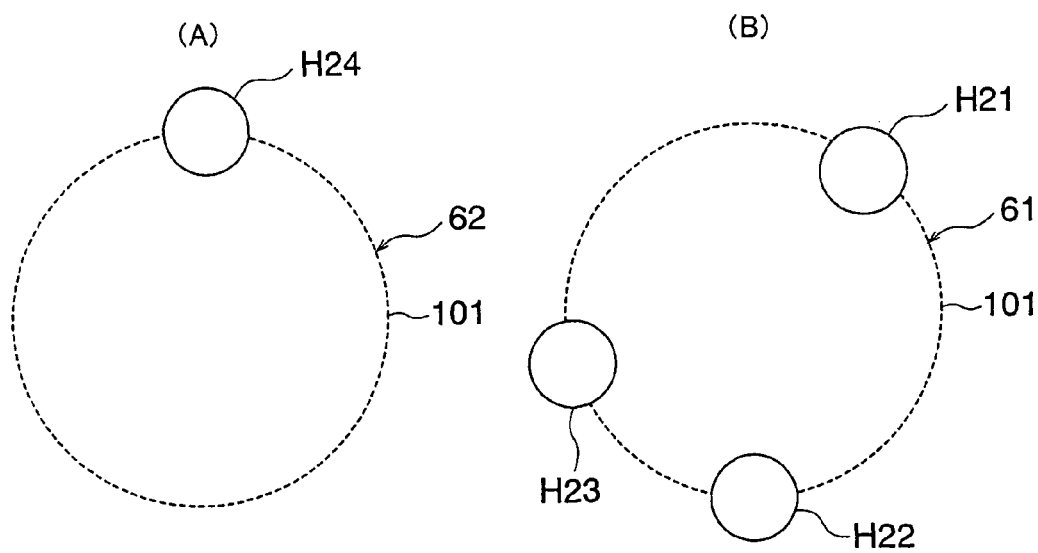
FIG. 17 is a view of the arrangement of holes of the first and second shutter plates of the fourth embodiment of the double-layer shutter control method.

Next, a fourth embodiment of the double-layer shutter control method will be explained by referring to FIG. 16 to FIG. 18. In this embodiment, another example of the single sputtering for five targets will be explained. In FIG. 16 and FIG. 17, the five targets are indicated by T1 to T5, the holes of the first shutter plate 61 facing the targets are indicated by H21, H22, and H23, and the hole of the shutter plate 62 on the substrate side is indicated by H24. The holes H21, H22, and H23 in the first shutter plate 61 are formed at positions 144° and 216° apart in the clockwise direction from H21. Further, in FIG. 16 and FIG. 17, the circles 101 indicate the paths of movement of the holes H21 to H24 when the two shutter plates 61 and 62 rotate.

Figure 18:
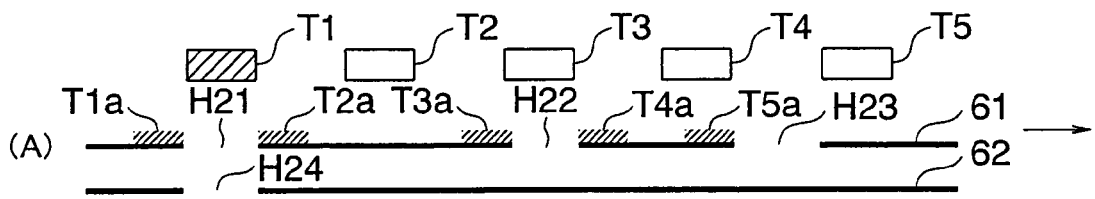
FIG. 18 is a state transition diagram showing the change of positions of the first and second shutter plates at the time of the main sputtering of the fourth embodiment of the double-layer shutter control method.
Figure 18:
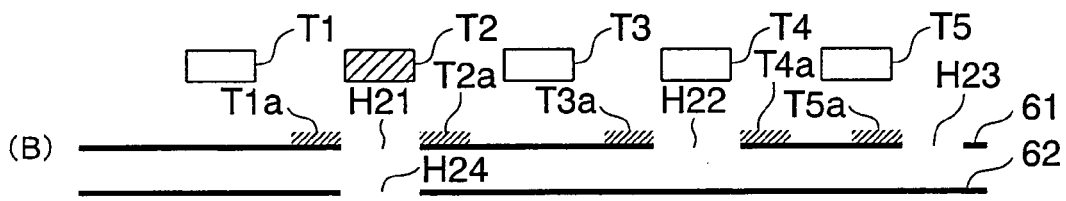
Figure 18:
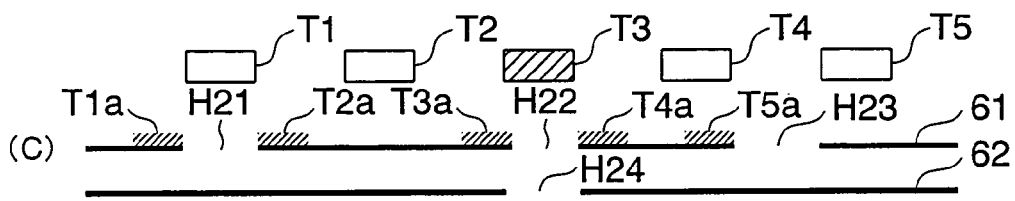
Figure 18:
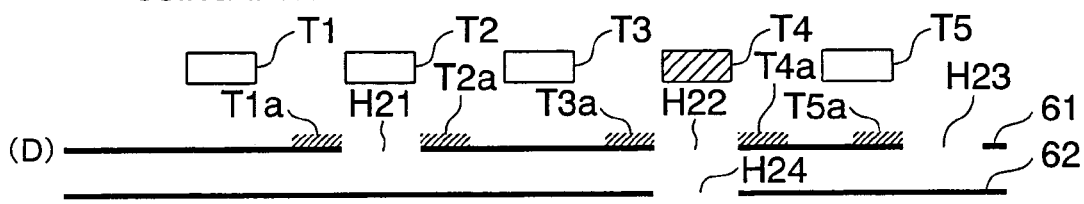
Figure 18:
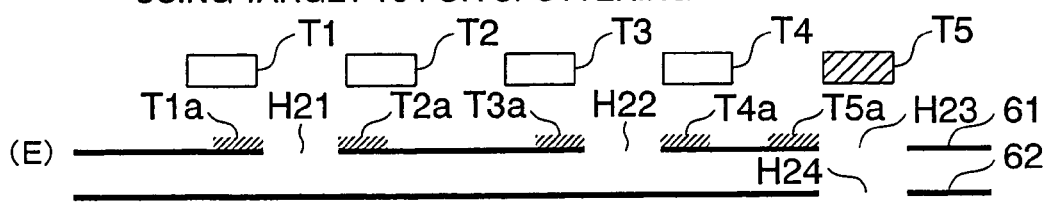

(A) to (E) of FIG. 18 show the positions of rotation movement of the first shutter plate 61 and the second shutter plate 62 in each case when sequentially using five targets T1 to T5 for the main sputtering in the sequence of T1, T2, T3, T4, and T5. In the following explanation, assume that the step of the pre-sputtering is carried out before the step of the main sputtering for a certain target.

(A) of FIG. 18 shows the state of using the target T1 for the main sputtering. Deposits T1a, T2a, T3a, T4a, and T5a deposited on the surface of the first shutter plate 61 are comprised of the substances of the targets T1 to T5 deposited at stages of the pre-sputtering before that.

As shown in (A) of FIG. 18, at the time of the pre-sputtering, the rotation operation of the first shutter plate 61 is controlled so that locations of the deposits T1a to T5a face the targets T1 to T5.

When using the target T1 for the main sputtering, at the time of the pre-sputtering, the second shutter plate 62 is rotated so as to align the hole H24 of the second shutter plate 62 with the target T1, then the first shutter plate 61 on which the deposits T1a to T5a are deposited is rotated so that the hole H21 is aligned with the target T1. Due to this, the hole H21 of the first shutter plate 61 and the hole H24 of the second shutter plate 62 are aligned to expose the target T1 with respect to the substrate and perform the main sputtering. In the above description, only the deposit T1a passes through a location frontally facing the target T1 due to the rotation operation of the first shutter plate 61 from the pre-sputtering state to the main sputtering state. For this reason, the cross-contamination explained above can be prevented. Note that no other target substances will pass through locations frontally facing the other targets T1, T3, T4, and T5 due to the rotation operation of the first shutter plate 61 from the pre-sputtering state to the main sputtering state.

(B) of FIG. 18 shows the state of next using the target T2 for the main sputtering. Deposits T1a to T5a deposited on the surface of the first shutter plate 61 are comprised of the substances of the targets T1 to T5 deposited at stages of the pre-sputtering before that. When using the target T2 for the main sputtering, at the time of the pre-sputtering, the second shutter plate 62 is rotated so as to align the hole H24 thereof with the target T2, then the first shutter plate 61 on which the deposits T1a to T5a are deposited is rotated so that the hole H21 thereof is aligned with the target T2. Due to this, the hole H21 of the first shutter plate 61 and the hole H24 of the second shutter plate 62 are aligned to expose the target T2 with respect to the substrate and perform the main sputtering. In the above description, only the deposit T2a passes through a location frontally facing the target T2 due to the rotation operation of the first shutter plate 61 from the pre-sputtering state to the main sputtering state. For this reason, the cross-contamination explained above can be prevented at the target T2.

(C) of FIG. 18 shows the state of next using the target T3 for the main sputtering. Deposits T1a to T5a deposited on the surface of the first shutter plate 61 are comprised of the substances of the targets T1 to T5 deposited at stages of the pre-sputtering before that. When using the target T3 for the main sputtering, at the time of the pre-sputtering, the second shutter plate 62 is rotated so as to align the hole H24 thereof with the target T3, then the first shutter plate 61 on which the deposits T1a to T5a are deposited is rotated so that the hole H22 thereof is aligned with the target T3. Due to this, the hole H22 of the first shutter plate 61 and the hole H24 of the second shutter plate 62 are aligned to expose the target T2 with respect to the substrate and perform the main sputtering. In the above description, only the deposit T3a passes through a location frontally facing the target T3 due to the rotation operation of the first shutter plate 61 from the pre-sputtering state to the main sputtering state. For this reason, the cross-contamination explained above can be prevented at the target T3.

(D) of FIG. 18 shows the state of next using the target T4 for the main sputtering. Deposits T1a to T5a deposited on the surface of the first shutter plate 61 are comprised of the substances of the targets T1 to T5 deposited at stages of the pre-sputtering before that. When using the target T4 for the main sputtering, at the time of the pre-sputtering, the second shutter plate 62 is rotated so as to align the hole H24 thereof with the target T4, then the first shutter plate 61 on which the deposits T1a to T5a are deposited is rotated so that the hole H22 thereof is aligned with the target T4. Due to this, the hole H22 of the first shutter plate 61 and the hole H24 of the second shutter plate 62 are aligned to expose the target T4 with respect to the substrate and perform the main sputtering. In the above description, only the deposit T4a passes through a location frontally facing the target T4 due to the rotation operation of the first shutter plate 61 from the pre-sputtering state to the main sputtering state. For this reason, the cross-contamination explained above can be prevented at the target T4.

(E) of FIG. 18 shows the state of next using the target T5 for the main sputtering. Deposits T1a to T5a deposited on the surface of the first shutter plate 61 are comprised of the substances of the targets T1 to T5 deposited at stages of the pre-sputtering before that. When using the target T5 for the main sputtering, at the time of the pre-sputtering, the second shutter plate 62 is rotated so as to align the hole H24 thereof with the target T5, then the first shutter plate 61 on which the deposits T1a to T5a are deposited is rotated so that the hole H23 thereof is aligned with the target T5. Due to this, the hole H23 of the first shutter plate 61 and the hole H24 of the second shutter plate 62 are aligned to expose the target T5 with respect to the substrate and perform the main sputtering. In the above description, only the deposit T5a passes a location frontally facing the target T5 due to the rotation operation of the first shutter plate 61 from the pre-sputtering state to the main sputtering state. For this reason, the cross-contamination explained above can be prevented at the target T5.

Fifth Embodiment

Figure 19:
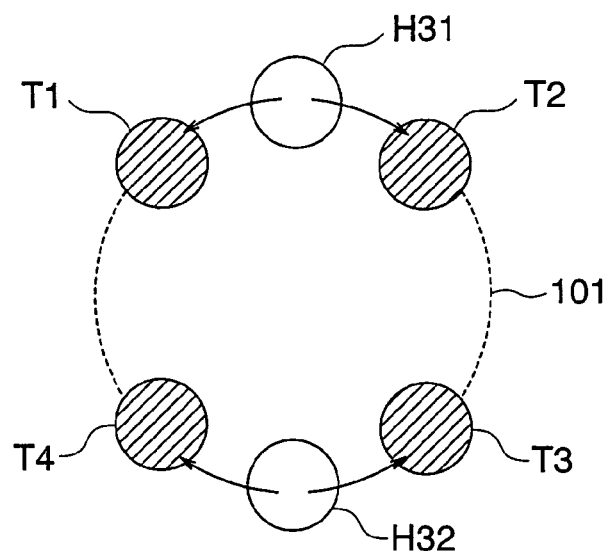
FIG. 19 is a view of the arrangement of targets of a fifth embodiment of the double-layer shutter control method according to the present invention.

Next, a fifth embodiment of the double-layer shutter control method will be explained by referring to FIG. 19 to FIG. 21. In this embodiment, an example of four targets and co-sputtering will be explained. FIG. 19 corresponds to the above FIG. 8, while FIG. 20 corresponds to the above FIG. 9.

Figure 20:
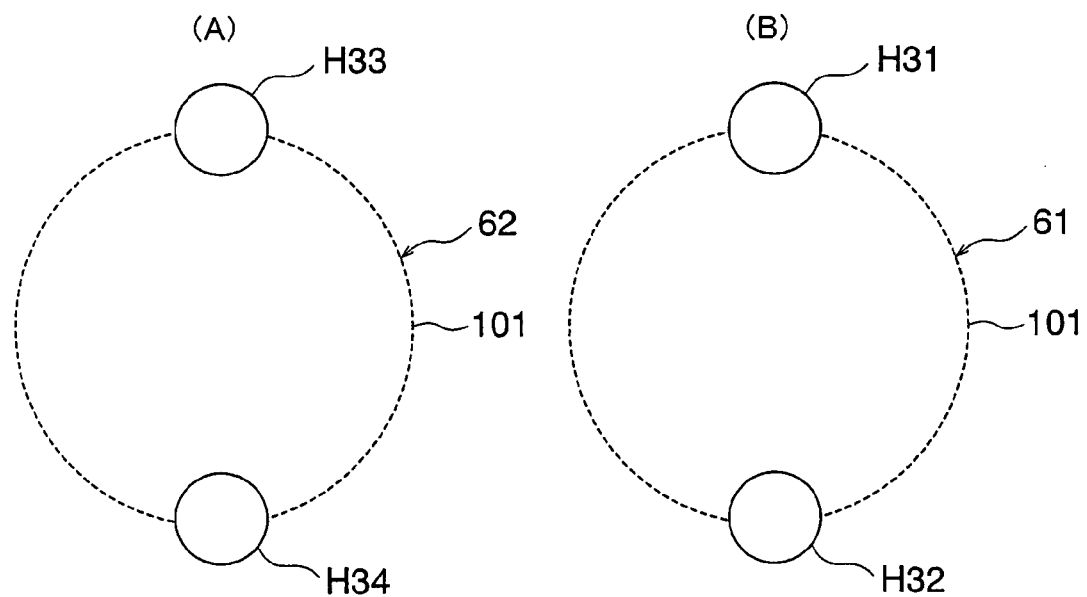
FIG. 20 is a view of the arrangement of holes of the first and second shutter plates of the fifth embodiment of the double-layer shutter control method.
Figure 21:
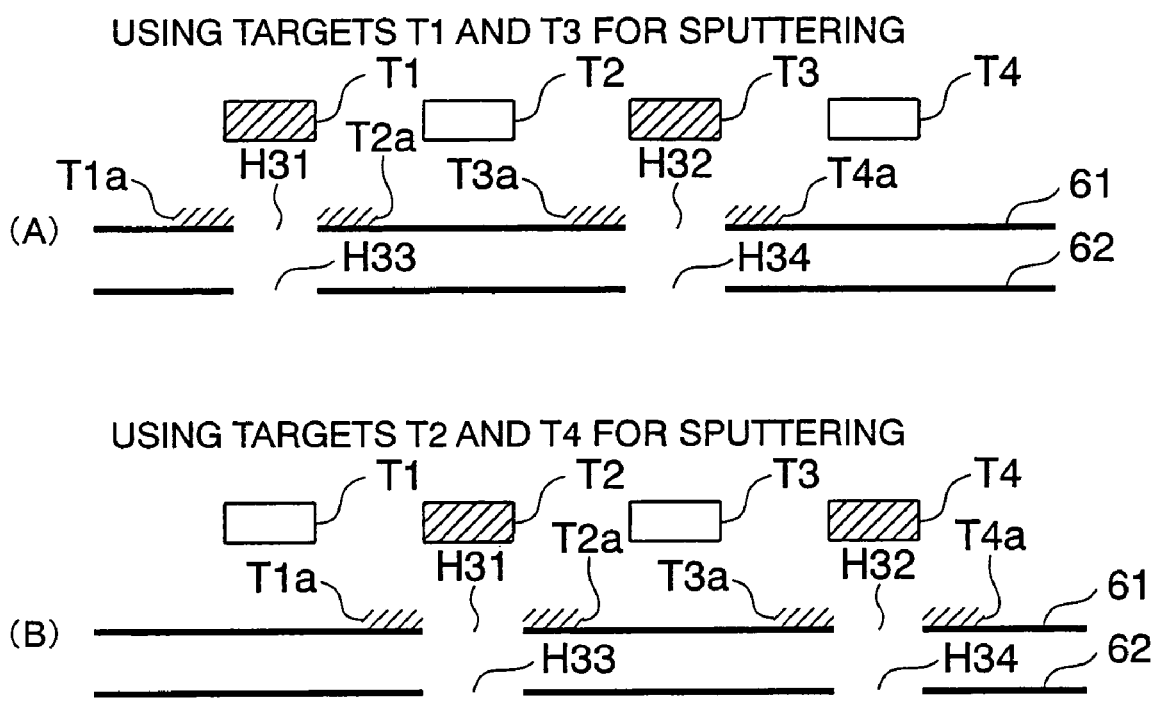
FIG. 21 is a state transition diagram showing the change of positions of the first and second shutter plates at the time of the main sputtering of the fifth embodiment of the double-layer shutter control method.

In FIG. 19 to FIG. 21, the same notations are assigned to the same components as the components explained in FIG. 8 etc. The four targets are indicated by T1 to T4, the holes of the first shutter plate 61 facing the targets are indicated by H31 and H32, and the holes of the second shutter plate 62 on the substrate side are indicated by H33 and H34. In the first shutter plate 61, two holes H31 and H32 are formed at positions 180° apart, while in the second shutter plate 62, two holes H33 and H34 are formed at positions 180° apart.

(A) and (B) of FIG. 21 show the positions of rotation movement of the first shutter plate 61 and the second shutter plate 62 in the cases of sequentially using the four targets T1 to T4 for the main sputtering in the sequences of the combinations of the targets T1 and T3 and the targets T2 and T4. The step of the pre-sputtering is carried out before the step of the main sputtering for a certain target.

(A) of FIG. 21 shows a state of next using the targets T1 and T3 for the main sputtering. Deposits T1a, T2a, T3a, and T4a deposited on the surface of the first shutter plate 61 are comprised of the substances of the targets T1 to T4 deposited at stages of the pre-sputtering before that.

As shown in (A) of FIG. 21, the rotation operation of the first shutter plate 61 is controlled so that the locations of the deposits T1a to T4a face to the targets T1 to T4 at the time of the pre-sputtering. When using the targets T1 and T3 for the main sputtering, at the time of pre-sputtering, the holes H33 and H34 of the second shutter plate 62 are aligned with the targets T1 and T3, then the first shutter plate 61 on which the deposits T1a to T4a are deposited is rotated so that the holes H31 and H32 thereof are aligned with the targets T1 and T3. Due to this, the holes H31 and H32 of the first shutter plate 61 and the holes H33 and H34 of the second shutter plate 62 are aligned to expose the targets T1 and T3 with respect to the substrate and perform the main sputtering. In the above description, only the deposits T1a and T3a pass through locations frontally facing the targets T1 and T3 due to the rotation operation of the first shutter plate 61 from the pre-sputtering state to the main sputtering state. For this reason, the cross-contamination explained above can be prevented.

(B) of FIG. 21 shows a state of next using the targets T2 and T4 for the main sputtering. The deposits T1a to T4a deposited on the surface of the first shutter plate 61 are comprised of the substances of the targets T1 to T4 deposited at stages of the pre-sputtering before that. When using the targets T2 and T4 for the main sputtering, at the time of pre-sputtering, the holes H33 and H34 of the second shutter plate 62 are aligned with the targets T2 and T4, then the first shutter plate 61 on which the deposits T1a to T4a are deposited is rotated so that the holes H31 and H32 thereof are aligned with the targets T2 and T4. Due to this, the holes H31 and H32 of the first shutter plate 61 and the holes H33 and H34 of the second shutter plate 62 are aligned to expose the targets T2 and T4 with respect to the substrate and perform the main sputtering. In the above description, only the deposits T2a and T4a pass through locations frontally facing the targets T2 and T4 due to the rotation operation of the first shutter plate 61 from the pre-sputtering state to the main sputtering state. For this reason, the cross-contamination explained above can be prevented at the targets T2 and T4.

Sixth Embodiment

Figure 22:
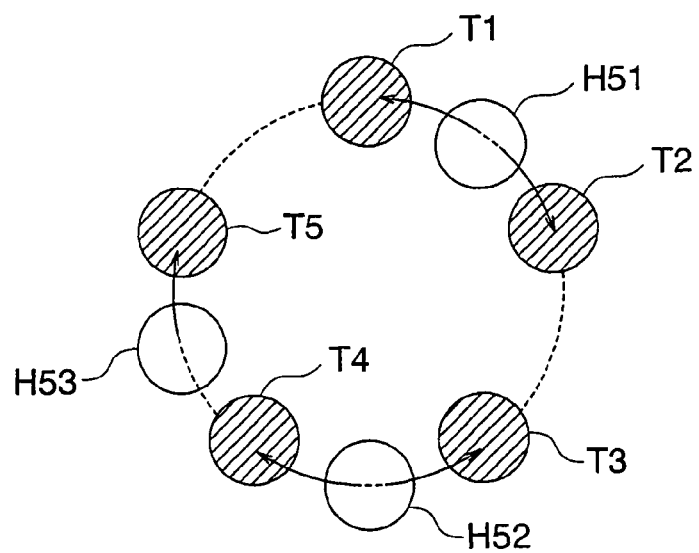
FIG. 22 is a view of the arrangement of targets of a sixth embodiment of the double-layer shutter control method according to the present invention.
Figure 23:
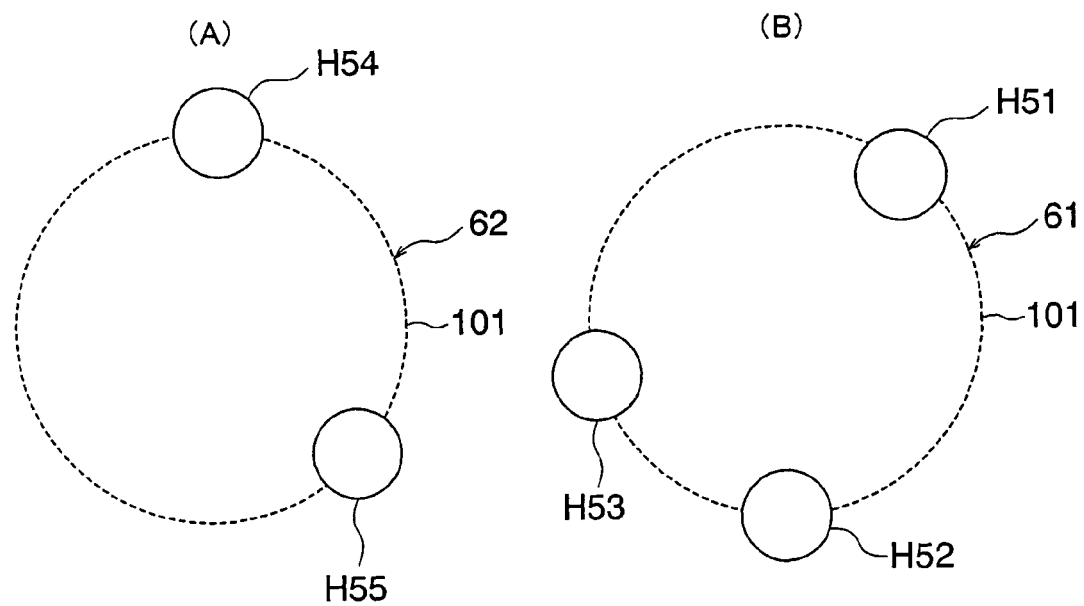
FIG. 23 is a view of the arrangement of holes of the first and second shutter plates of the sixth embodiment of the double-layer shutter control method.
Figure 24:
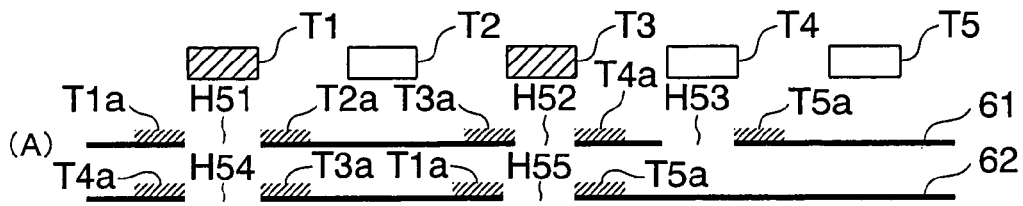
FIG. 24 is a state transition diagram showing the change of positions of the first and second shutter plates at the time of the main sputtering of the sixth embodiment of the double-layer shutter control method.
Figure 24:
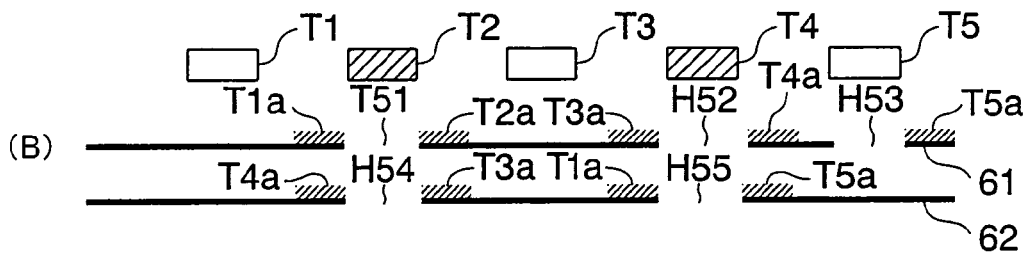
Figure 24:
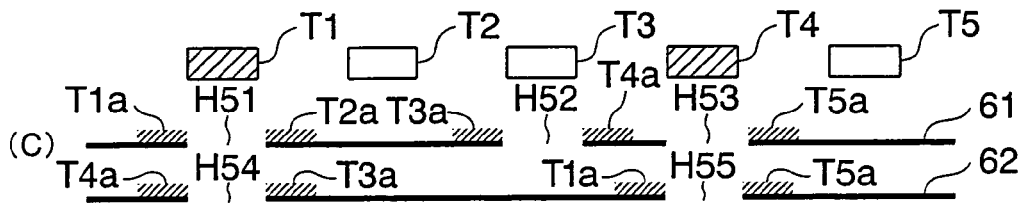
Figure 24:
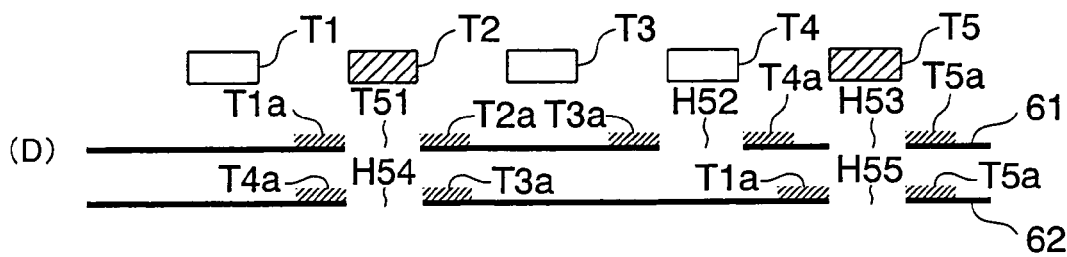
Figure 24:
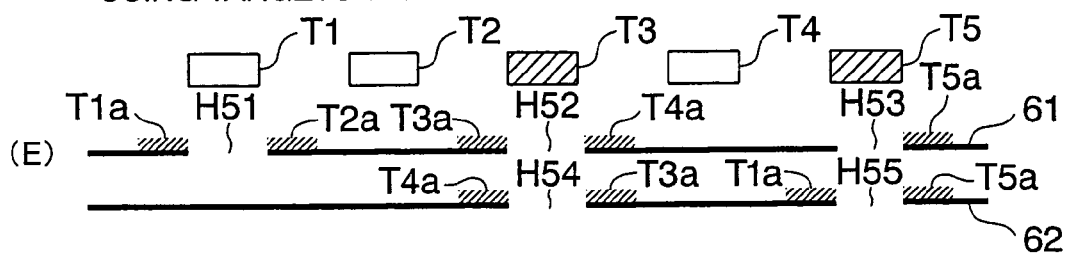

Next, a sixth embodiment of the double-layer shutter control method will be explained by referring to FIG. 22 to FIG. 24. This embodiment is an example of five targets and co-sputtering. In FIG. 22 to FIG. 24, the same notations are assigned to the same components as the components explained in the previous embodiments. The five targets are indicated by T1 to T5, the holes of the first shutter plate 61 facing the targets are indicated by H51, H52, and H53, and the holes of the second shutter plate 62 on the substrate side are indicated by H54 and H55. In the first shutter plate 61, three holes H51, H52, and H53 are formed at positions 144° and 72° apart in the clockwise direction, while in the second shutter plate 62, two holes H54 and H55 are formed at positions 144° apart in the clockwise direction.

As shown in FIG. 24, in the case of the present embodiment as well, the main sputtering is sequentially carried out for the five targets T1 to T5 in the sequence of the combinations of the targets T1 and T3, the targets T2 and T4, the targets T1 and T4, and the targets T2 and T5. FIG. 24 shows the positions of rotation movement of the first shutter plate 61 and the second shutter plate 62 in the case of the main sputtering. The step of the pre-sputtering is carried out before the step of the main sputtering for a certain target.

(A) of FIG. 24 shows a state of using the two targets T1 and T3 for the main sputtering. Deposits T1a, T2a, T3a, T4a, and T5a deposited on the surface of the first shutter plate 61 are comprised of the substances of the targets T1 to T5 deposited at stages of the pre-sputtering before that.

As shown in (A) of FIG. 24, the rotation operation of the first shutter plate 61 is controlled so that the locations of the deposits T1a to T5a face the targets T1 to T5 at the time of the pre-sputtering. When using the targets T1 and T3 for the main sputtering, at the time of pre-sputtering, the holes H54 and H55 of the second shutter plate 62 are aligned with the targets T1 and T3, then the first shutter plate 61 on which the deposits T1a to T5a are deposited is rotated so that the holes H51 and H52 thereof are aligned with the targets T1 and T3. Due to this, the holes H51 and H52 of the first shutter plate 61 and the holes H54 and H55 of the second shutter plate 62 are aligned to expose the targets T1 and T3 with respect to the substrate and perform the main sputtering. In the above description, only the deposits T1a and T3a pass through locations frontally facing the targets T1 and T3 due to the rotation operation of the first shutter plate 61 from the pre-sputtering state to the main sputtering state. For this reason, the cross-contamination explained above can be prevented.

(B) of FIG. 24 shows a state of next using the targets T2 and T4 for the main sputtering. The deposits T1a to T5a deposited on the surface of the first shutter plate 61 are comprised of the substances of the targets T1 to T5 deposited at stages of the pre-sputtering before that. When using the targets T2 and T4 for the main sputtering, at the time of pre-sputtering, the holes H54 and H55 of the second shutter plate 62 are aligned with the targets T2 and T4, then the first shutter plate 61 on which the deposits T1a to T5a are deposited is rotated so that the holes H51 and H52 thereof are aligned with the targets T2 and T4. Due to this, the holes H51 and H52 of the first shutter plate 61 and the holes H54 and H55 of the second shutter plate 62 are aligned to expose the targets T2 and T4 with respect to the substrate and perform the main sputtering. In the above description, only the deposits T2a and T4a pass through locations frontally facing the targets T2 and T4 due to the rotation operation of the first shutter plate 61 from the pre-sputtering state to the main sputtering state. For this reason, the cross-contamination explained above can be prevented at the targets T2 and T4.

(C) of FIG. 24 shows a state of next using the targets T1 and T4 for the main sputtering. The deposits T1a to T5a deposited on the surface of the first shutter plate 61 are comprised of the substances of the targets T1 to T5 deposited at the stages of the pre-sputtering before that. When using the targets T1 and T4 for the main sputtering, at the time of pre-sputtering, the holes H51 and H53 of the first shutter plate 61 are aligned with the targets T1 and T4, then the second shutter plate 62 on which the deposits T1a, T3a, T4a, and T5a are deposited is rotated so that the holes H54 and H55 thereof are aligned with the targets T1 and T4. Due to this, the holes H51 and H53 of the first shutter plate 61 and the holes H54 and H55 of the second shutter plate 62 are aligned to expose the targets T1 and T4 with respect to the substrate and perform the main sputtering. In the above description, only the deposits T1a and T4a pass through locations frontally facing the targets T1 and T4 due to the rotation operation of the first shutter plate 61 from the pre-sputtering state to the main sputtering state. For this reason, the cross-contamination explained above can be prevented at the targets T1 and T4.

(D) of FIG. 24 shows a state of next using the targets T2 and T5 for the main sputtering. The deposits T1a to T5a deposited on the surface of the first shutter plate 61 are comprised of the substances of the targets T1 to T5 deposited at the stages of the pre-sputtering before that. When using the targets T2 and T5 for the main sputtering, at the time of pre-sputtering, the holes H54 and H55 of the second shutter plate 62 are aligned with the targets T2 and T5, then the first shutter plate 61 on which the deposits T1a to T5a are deposited is rotated so that the holes H51 and H53 thereof are aligned with the targets T2 and T5. Due to this, the holes H51 and H53 of the first shutter plate 61 and the holes H54 and H55 of the second shutter plate 62 are aligned to expose the targets T2 and T5 with respect to the substrate and perform the main sputtering. In the above description, only the deposits T2a and T5a pass through locations frontally facing the targets T2 and T5 due to the rotation operation of the first shutter plate 61 from the pre-sputtering state to the main sputtering state. For this reason, the cross-contamination explained above can be prevented at the targets T2 and T5.

(E) of FIG. 24 shows a state of next using the targets T3 and T5 for the main sputtering next. Deposits T1a to T5a deposited on the surface of the first shutter plate 61 are comprised of the substances of the targets T1 to T5 deposited at the stages of the pre-sputtering before that. When using the targets T3 and T5 for the main sputtering, at the time of pre-sputtering, the holes H51 and H53 of the first shutter plate 61 are aligned with the targets T3 and T5, then the second shutter plate 62 on which the deposits T1a, T3a, T4a, and T5a are deposited is rotated so that the holes H54 and H55 thereof are aligned with the targets T3 and T5. Due to this, only the deposits T3a and T3a pass through locations frontally facing the targets T3 and T5. For this reason, the cross-contamination explained above can be prevented at the targets T3 and T5.

In the above double-layer shutter control method, the number of holes formed in each shutter plate for different numbers (n) of targets and the shutters used for the pre-sputtering can be classified as in the table shown in FIG. 25.

The configurations, shapes, sizes, and relative arrangements explained in the above embodiments are only generally shown to an extent enabling the present invention to be understood and worked. The numerical values and compositions (materials) of the configurations are only examples. Accordingly, the present invention is not limited to the explained embodiments. The present invention can be changed in a variety of ways so far as it is not out of the range of the technical ideas shown in the claims.

The present disclosure relates to subject matter contained in Japanese Patent Application No. 2004-70929, filed on Mar. 12, 2004, the disclosure of which is expressly incorporated herein by reference in its entirety.

What we claim is:

1. A double-layer shutter control method of a multi-sputtering system, for controlling rotation positions of first and second shutter plates rotatably arranged between a substrate and at least three targets, and each of the first and second shutter plates having at least one hole and being rotated independently of each other, the method comprising:

sputtering in a first sputtering step a selected one or more of the targets selected as an object to be sputtered while blocking the substrate from the selected one or more of the targets by the first shutter plate;

sputtering in a second sputtering step the selected one or more of the targets in a state that the first and second shutter plates are positionally arranged so that the substrate is exposed to the selected one or more of the targets through the holes of the first and second shutter plates and the substrate is blocked from the other targets except the selected one or more of the targets by the second shutter plate, rotating the first shutter plate so that a surface spot of the first shutter plate to which only a substance identical to a substance of a particular one of the targets is adhered faces the particular one target, and afterwards the first sputtering step is carried out while the surface spot faces the particular one of the targets, and further afterwards, when making the transition from the first sputtering step to the second sputtering step, the first shutter plate is rotated so that surface spots of the first shutter plate to which substances different from the substance of the selected one or more of the targets are adhered move so as not to face the selected one or more of the targets.

2. The double-layer shutter control method of a multi-sputtering system as set forth in claim 1, wherein rotation movements of the first and second shutter plates are controlled so that the surface spots of the first shutter plate to which the substances different from the substance of the selected one or more of the targets are adhered move so as not to face the selected one or more of the targets during the first sputtering step.

3. The double-layer shutter control method of a multi-sputtering system as set forth in claim 1, wherein when carrying out the second sputtering step, the first target is exposed to the substrate through the holes of the first and second shutter plates, which are at a same position.

4. The double-layer shutter control method of a multi-sputtering system as set forth in claim 3, wherein when carrying out the first and second sputtering steps by selecting only one target from the at least three targets and using the selected only one target as the selected one or more of the targets, the selected only one target is exposed to the substrate through the holes of the first and second shutter plates in the second sputtering step, which are at the same position.

5. The double-layer shutter control method of a multi-sputtering system as set forth in claim 3, wherein when carrying out the first and second sputtering steps by selecting two or more targets from the at least three targets and using them as the selected one or more of the targets, the two or more targets are respectively exposed to the substrate through the holes of the first and second shutter plates in the second sputtering step, which are at the same position.

6. The double-layer shutter control method of a multi-sputtering system as set forth in claim 1, wherein when the number of the at least three targets is an even number (n:n>3), the number of the holes of said first shutter plate is n/2.

7. The double-layer shutter control method of a multi-sputtering system as set forth in claim 1, wherein when the number of the at least three targets is an odd number (n: n3), the number of the holes of said first shutter plate is INT(n/2)+1.

8. A double-layer shutter control method of a multi-sputtering system, for controlling rotation positions of first and second shutter plates rotatably arranged between a substrate and five targets respectively made of different substances, and each of the first and second shutter plates having two holes and being rotated independently, comprising:

sputtering in a first sputtering step a selected one or more of the targets selected as an object to be sputtered while blocking the substrate from the selected one or more of the targets by the first shutter plate, sputtering in a second sputtering step the selected one or more of the targets in a state that the first and second shutter plates are positionally arranged so that the substrate is exposed to the selected one or more of the targets through the holes of the first and second shutter plates and the substrate is blocked from the other targets except the selected one or more of the targets by the second shutter plate, wherein the first and second sputtering steps are carried out to deposit films on the substrate, and the sputtering is carried out using the selected one or more of the targets, in the first and second sputtering steps in which the selected one or more of the targets are used and in the first and second sputtering steps in which only one target is used as the selected one or more of the targets, rotating the first shutter plate so that a surface spot of the first shutter plate to which a substance identical to a substance of a particular one of the targets is adhered faces the particular one target, and afterwards the first sputtering step is carried out, and further afterwards, when making the transition from the first sputtering step to the second sputtering step, the first shutter plate is rotated so that surface spots of the first shutter plate to which substances different from the substance of the selected one or more of the targets are adhered move so as not to face to the selected one or more of the targets, thereby, in one chamber unit, the first and second sputtering steps in which the two or more targets are used as the selected one or more of the targets, and the first and second steps in which only one target is used as the selected one or more of the targets are carried out.

9. The double-layer shutter control method of a multi-sputtering system as set forth in claim 8, wherein in the sputtering in which two or more targets selected as the selected one or more of the targets are used and only one target selected as the selected one or more of the targets is used, each rotation movement of the first and second shutter plates is controlled so as to first carry out the sputtering in which the two or more targets are used.

10. The double-layer shutter control method of a multi-sputtering system as set forth in claim 9, wherein the sputtering in which the two or more targets are used is carried out earlier and the sputtering in which only one target is used is carried out later.

11. The double-layer shutter control method of a multi-sputtering system as set forth in claim 8, wherein when carrying out the second sputtering step, said only one target is exposed to the substrate through the holes of the first and second shutter plates, which are at a same position.

* * * * *